(12) United States Patent
Yamamoto et al.

(10) Patent No.: US 8,888,379 B2
(45) Date of Patent: Nov. 18, 2014

(54) ELECTRONIC DEVICE

(71) Applicant: Fujitsu Limited, Kawasaki (JP)

(72) Inventors: Yasufumi Yamamoto, Kawasaki (JP); Masuo Ohnishi, Hachioji (JE)

(73) Assignee: Fujitsu Limited, Kawasaki (JP)

( * ) Notice: Subject to any disclaimer, the term of this patent is extended or adjusted under 35 U.S.C. 154(b) by 22 days.

(21) Appl. No.: 13/760,439

(22) Filed: Feb. 6, 2013

(65) Prior Publication Data

US 2013/0215561 A1    Aug. 22, 2013

(30) Foreign Application Priority Data

Feb. 17, 2012    (JP) .................................. 2012-033254

(51) Int. Cl.
    *G02B 6/36*    (2006.01)
    *H05K 7/00*    (2006.01)
    *G06F 1/16*    (2006.01)

(52) U.S. Cl.
    CPC ... *H05K 7/00* (2013.01); *G06F 1/16* (2013.01)
    USPC ........................................................... 385/88

(58) Field of Classification Search
    CPC .. G02B 6/4292; G02B 6/4246; G02B 6/4214; G02B 6/36
    USPC ..................................... 385/88, 89, 90, 91, 92
    See application file for complete search history.

(56) References Cited

FOREIGN PATENT DOCUMENTS

| JP | 2001-203916 A | 7/2001 |
| JP | 2005-106642 A | 4/2005 |
| JP | 2005-286889 A | * 10/2005 |

* cited by examiner

*Primary Examiner* — Jennifer Doan
(74) *Attorney, Agent, or Firm* — Westerman, Hattori, Daniels & Adrian, LLP

(57) ABSTRACT

There is provided an electronic device which includes a housing, an opening formed in the housing, a light receiving unit which is disposed inside the housing and is configured to receive an optical signal which enters through the opening, and an optical path changing unit which changes, to guide to the light receiving unit, a travelling direction of at least one of a first optical signal arriving from a first direction in respect to the housing and a second optical signal arriving from a second direction in respect to the housing, the first and second directions being opposite each other.

10 Claims, 19 Drawing Sheets

ELECTRONIC DEVICE

CROSS-REFERENCE TO RELATED APPLICATION

This application is based upon and claims the benefit of priority of the prior Japanese Patent Application No. 2012-033254, filed on Feb. 17, 2012, the entire contents of which are incorporated herein by reference.

FIELD

The embodiments relate to an electronic device.

BACKGROUND

Recently, operating electronic devices, such as personal computers, by remote control via a remote controller is increasing. For example, personal computers including a television tuner which provides a television function to display a television image on a monitor have been in practical use. In such personal computers with television function, channels of television images may be changed by remote control via a remote controller.

As an application of presentation, a projection type display, such as a projector, may be connected to a personal computer and a screen display of the personal computer may be projected on a screen in an enlarged manner using the projection type display. During the presentation, the display projected on the screen may be changed using a remote controller. A light receiving unit, for example, which receives an optical signal emitted by the remote controller is provided in a housing of the electronic device. The optical signal may be introduced in the housing through the opening formed in the housing.

Japanese Laid-open Patent Publication No. 2001-203916 and Japanese Laid-open Patent Publication No. 2005-106642 are examples of the related art.

SUMMARY

According to an aspect of the invention, an electronic device includes a housing, an opening formed in the housing, a light receiving unit which is disposed inside the housing and is configured to receive an optical signal which enters through the opening, and an optical path changing unit which changes, to guide to the light receiving unit, a travelling direction of at least one of a first optical signal arriving from a first direction in respect to the housing and a second optical signal arriving from a second direction in respect to the housing, the first and second directions being opposite each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The conventional device has a problem which is described below. The optical signal emitted by the remote controller has straightness and directivity. Therefore, it is desirable to adjust the orientation of a light emission unit of the remote controller and the orientation of the electronic device to some extent to achieve remote control of the electronic device. Therefore, if it is intended to perform remote control of the electronic device from, for example, both the front and back sides of the electronic device, there is a possibility that the optical signal coming from one of the front and back sides is not able to be received by the light receiving unit of the electronic device. In some cases, it has been desirable to increase the number of light receiving units in the electronic device to receive the optical signals from both the directions by the light receiving units.

The embodiment provides a technique to receive, by a light receiving unit, optical signals which arrive at a housing from two opposite directions without increasing the number of the light receiving units provided in an electronic device.

Hereinafter, embodiments will be described. Embodiments are illustrative only and the technical scope is not limited by the described embodiments.

Embodiment Provided for Comparison

Figure 1:
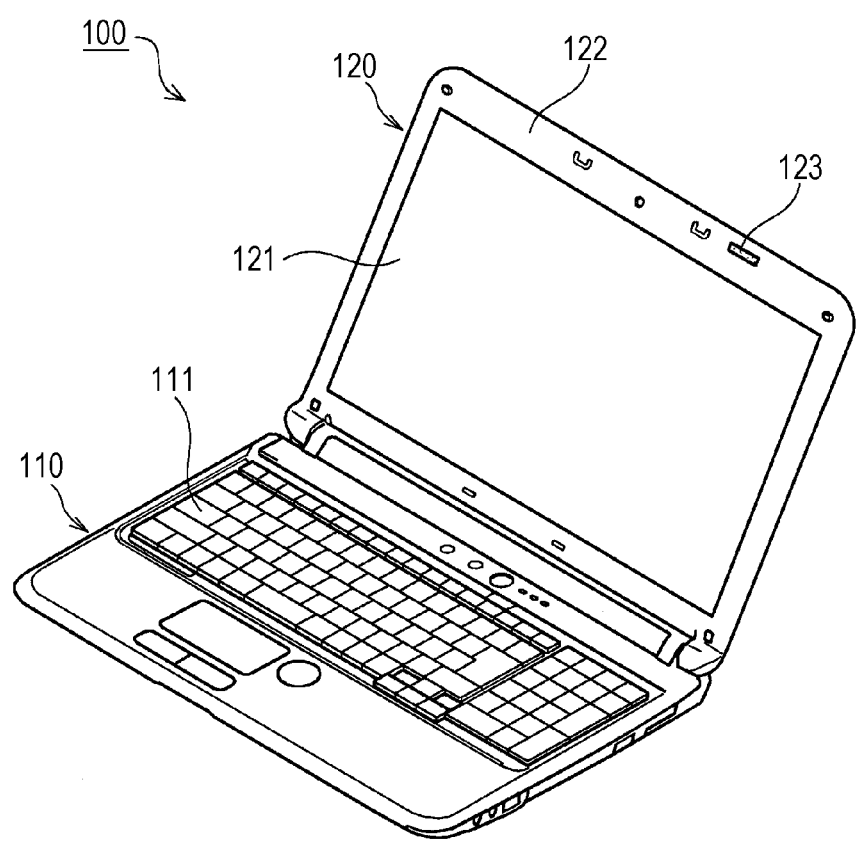
FIG. 1 is an exterior perspective view of an electronic device according to an embodiment provided for comparison.
Figure 2:
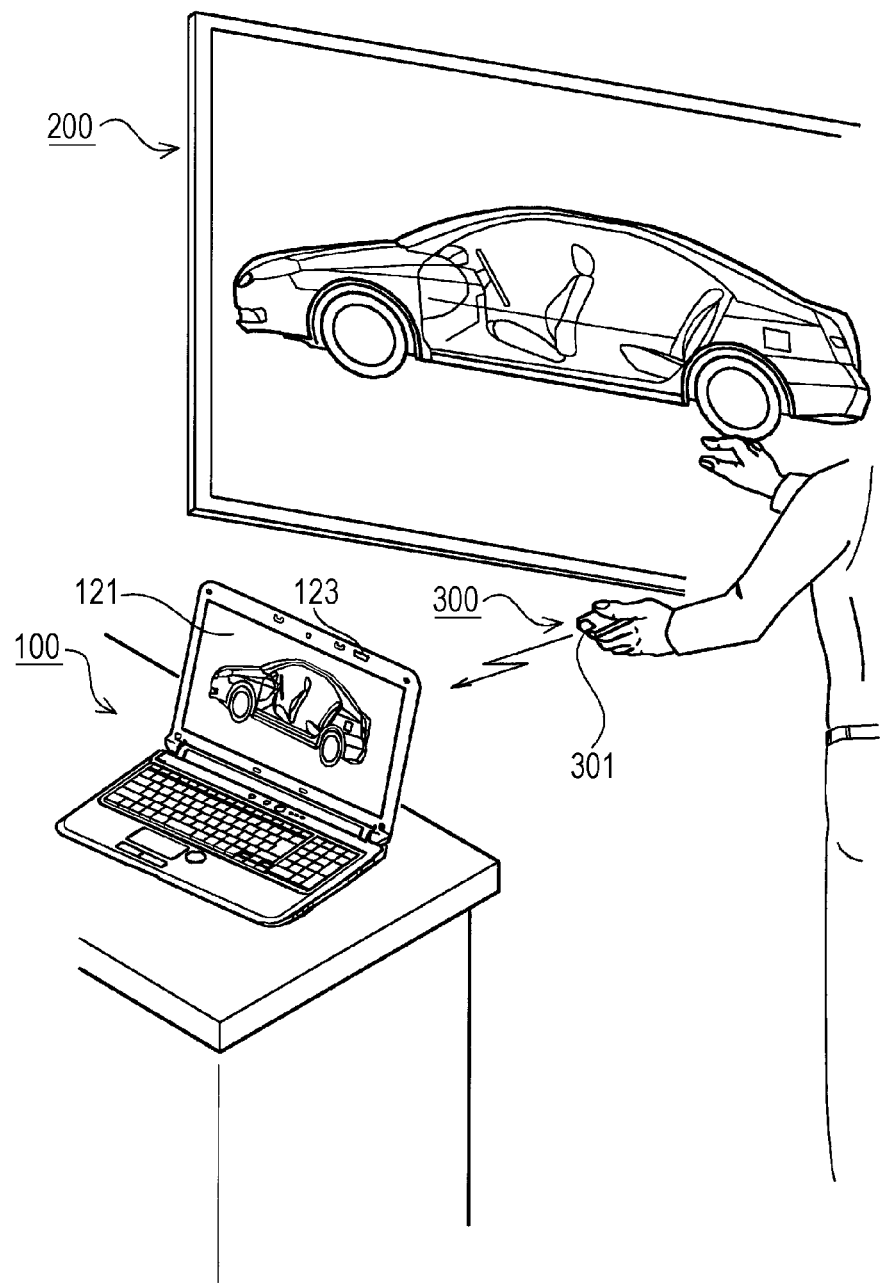
FIG. 2 is an explanatory view illustrating a state in which the electronic device according to the embodiment provided for comparison is used.

FIG. 1 is an exterior perspective view of an electronic device 100 according to an embodiment provided for comparison. The electronic device 100 is, for example, a notebook computer (or a "laptop computer"). FIG. 2 is an explanatory view illustrating a state in which the electronic device 100 is used. The electronic device 100 includes a main body 110 and a display device 120. The display device 120 is foldably connected to the main body 110 by means of a hinge. Input devices, such as a keyboard 111 and a pointing device (not illustrated), are built into the main body 110. A user may input instructions and data through the input device, such as the keyboard 111. In the display device 120, a flat display panel, such as a liquid crystal display (LCD) panel 121, is disposed inside a frame portion 122.

In FIG. 2, a screen is denoted by a reference numeral 200. A projector (not illustrated), which is a projection type display, is connected to the electronic device 100. A screen displayed on the electronic device 100 is projected on the screen 200 in an enlarged manner. The projector may project, on the screen 200 in an enlarged manner, an image which has been input from the electronic device 100. The image to be displayed on the screen may be generated in the projector.

FIG. 2 illustrates a state in which a user is making a presentation using the projector, the electronic device 100 and the screen 200. During the presentation, pages on the presentation software may be turned forward and backward by remote control of the electronic device 100 via a remote controller 300.

An exemplary remote controller 300 is an infrared remote controller which includes an infrared ray emission unit 301 and an operation button (not illustrated). When a user manipulates the operation button of the remote controller 300, infrared signals (i.e., optical signals) are emitted from an infrared ray emission unit 301 in accordance with the intended manipulation. The electronic device 100 includes an infrared sensor. When the infrared sensor receives the infrared signals from the remote controller 300, the presentation software of the electronic device 100 carries out processes in accordance with the received infrared signals. In this process, switching of the display screens, for example, is performed. Such remote control via the remote controller 300 may turn the pages forward and backward in cooperation with the presentation software of the electronic device 100 as described above.

Figure 3:
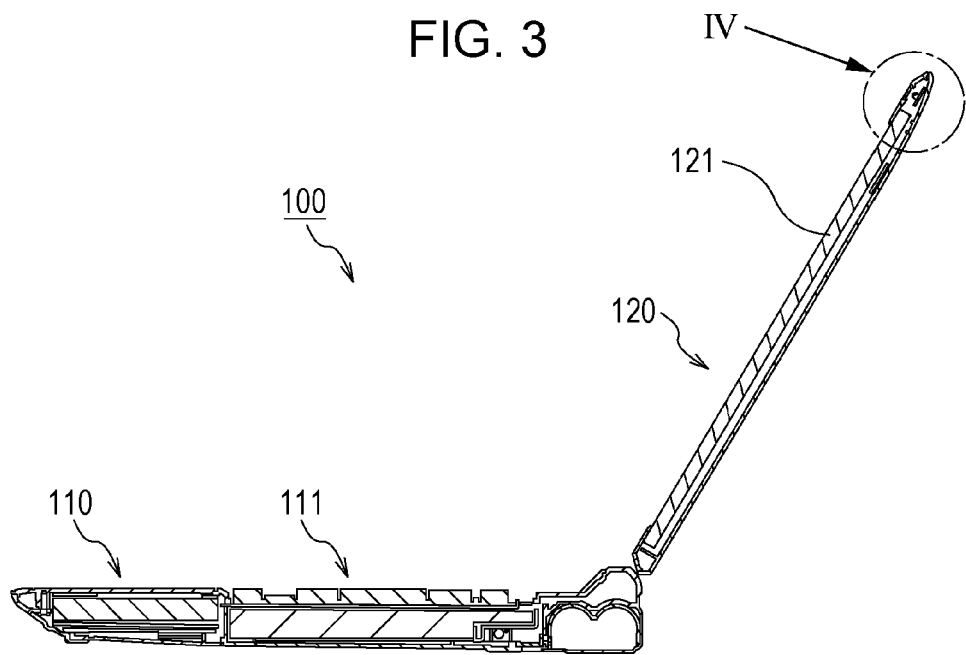
FIG. 3 is a cross-sectional view of the electronic device according to the embodiment provided for comparison.
Figure 4:
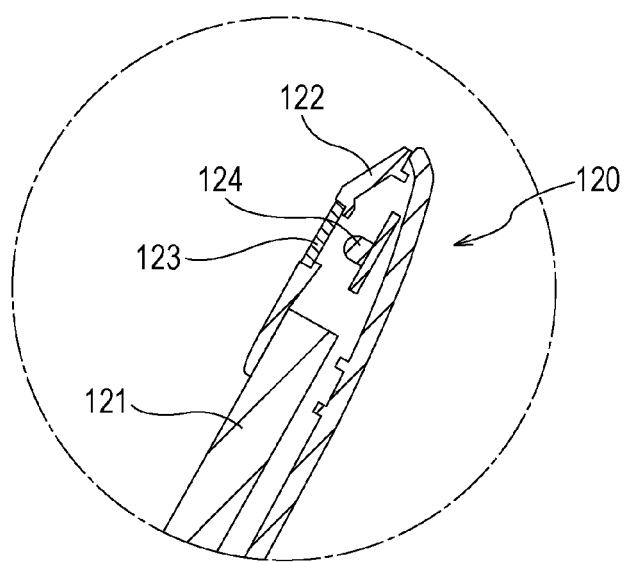
FIG. 4 is an enlarged view of an area IV illustrated in FIG. 3.

FIG. 3 is a cross-sectional view of the electronic device 100 according to the embodiment provided for comparison. FIG. 4 is an enlarged view of an area IV illustrated in FIG. 3. As illustrated also in FIGS. 1 and 2, an opening 123 is formed in the frame portion 122 of the display device 120. The infrared signals pass through the opening 123. As illustrated in FIGS. 3 and 4, an infrared sensor 124 for receiving the infrared signals is disposed inside the housing of the display device 120. In this embodiment provided for comparison, the infrared sensor 124 is disposed inside the display device 120 so as to be directed toward the front of the display surface of the liquid crystal display panel (hereafter, "LCD panel") 121. An infrared signal, which is emitted by the remote controller 300 and enters the housing of the display device 120 through the opening 123, is received by the infrared sensor 124.

Infrared communication does not use parts for receiving radio waves and the cost therefor may be lower than that of the radio wave communication. The infrared ray has straightness and directivity. Therefore, if an object which blocks infrared rays exists between the infrared ray emission unit 301 of the remote controller 300 and the infrared sensor 124, the infrared ray is not diffracted and thus is not easily received by the infrared sensor 124. Therefore, it is desirable to adjust the orientation of the infrared ray emission unit 301 of the remote controller 300 and the orientation of the infrared sensor 124 of the electronic device 100 to some extent to achieve remote control of the electronic device 100 via the remote controller 300.

In some cases, during the presentation, several presenters may turn pages forward and backward on the presentation software using their own remote controllers 300. For example, in a case in which the infrared rays are emitted by both the remote controllers 300 located at the front and back of the display surface of the LCD panel 121, there is a possibility that the infrared ray emitted by the remote controller 300 located at the back of the LCD panel 121 is not received by the infrared sensor 124. In the example illustrated in FIG. 2, the user manipulating the remote controller 300 is located at the back of the LCD panel 121.

The electronic device 100 may include, for example, a television tuner which provides a television function to display a television image on the LCD panel 121. When the television channels are changed, the remote controller 300 may be used for the remote control of the electronic device 100. Also in this case, for the same reason as that of the case of the presentation described above, the infrared rays emitted from the back, lateral and other directions of the electronic device 100 may be not easily received by the infrared sensor 124.

Hereinafter, the electronic devices according to the embodiments for solving the problems described above will be described in detail with reference to the drawings. The following embodiments are illustrative only and the electronic devices according to the embodiments are not limited to the embodiments.

First Embodiment

Figure 5:
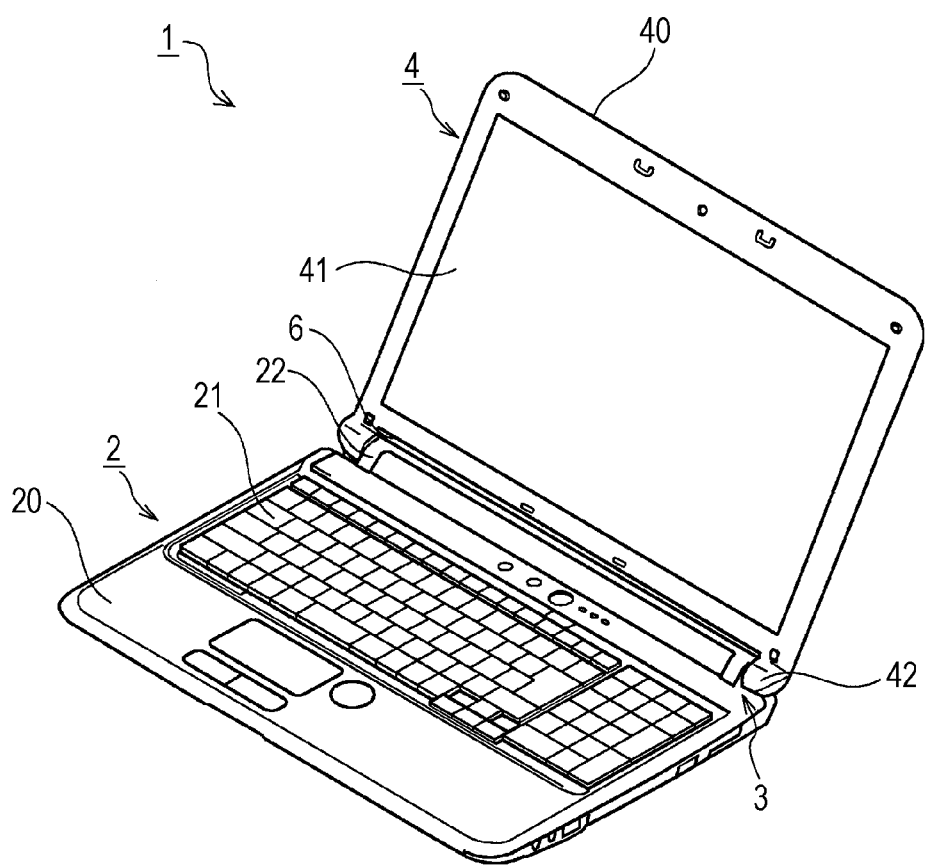
FIG. 5 is an exterior perspective view of an electronic device according to a first embodiment.
Figure 6:
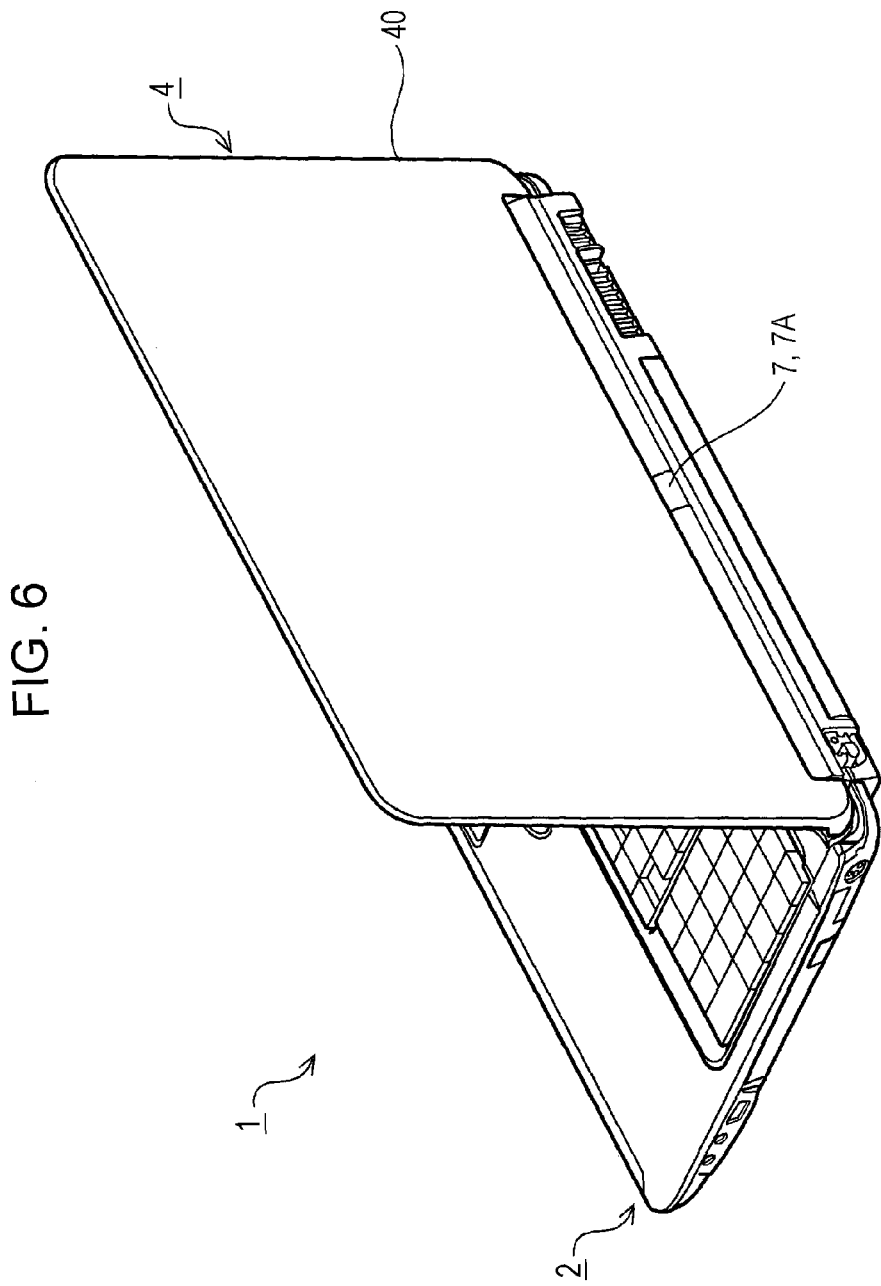
FIG. 6 is an exterior perspective view of the electronic device according to the first embodiment.
Figure 7:
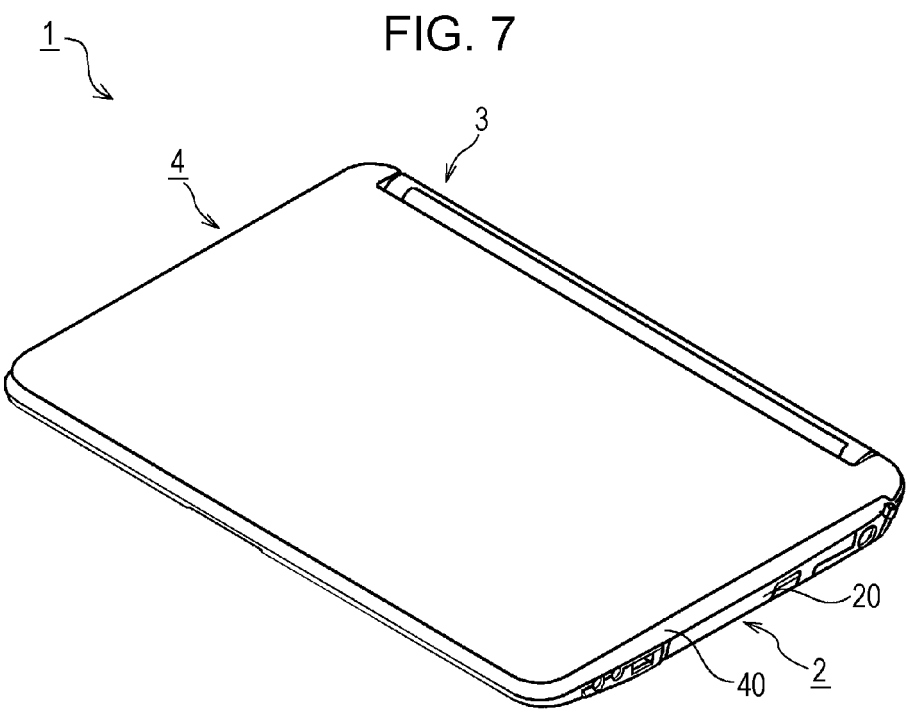
FIG. 7 is an exterior perspective view of the electronic device according to the first embodiment.

FIGS. 5 to 7 are exterior perspective views of an electronic device 1 according to a first embodiment. Hereinafter, a notebook computer will be described as an exemplary electronic device according to the first embodiment. An electronic device 1 includes a main body 2 and a display device 4. The display device 4 is pivotably connected to the main body 2 by means of a hinge 3. The display device 4 may be opened and closed with respect to the main body 2 through pivoting operation thereof via the hinge 3.

The main body 2 and the display device 4 are substantially rectangular in a plan view. However, the shape of the main body 2 and the display device 4 is not limited to the same. The hinge 3 joins the main body 2 and the display device 4 together at their longer sides. Hereafter, in a plan view, an end of the main body 2 at which the main body 2 is connected to the display device 4 via the hinge 3 is referred to as a "rear end" and an end opposite to the rear end is referred to as a "front end." The direction of a side edge along the longer side of the main body 2 and the display device 4 in a plan view is referred to as a "width direction." The hinge 3 is disposed at a rear portion of the main body 2. A hinge shaft of the hinge 3 is formed along a width direction of the main body 2 and the display device 4.

FIG. 5 is an upper front perspective view of the electronic device 1 with the display device 4 being opened. FIG. 6 is an upper back perspective view of the electronic device 1 with the display device 4 being opened. FIG. 7 is an upper front perspective view of the electronic device 1 with the display device 4 being closed. Here, "front" is a side on which a user who views the electronic device 1 from the front end side of the main body 2 is located. "Back" is a side on which the user who views the electronic device 1 from the rear end side of the main body 2 is located.

A housing of the main body 2 (hereafter, a "main body housing") is denoted by the reference numeral 20. A keyboard 21 is included on a surface of the main body 2. Printed circuits (not illustrated), such as a motherboard, are disposed inside the main body housing 20. On the motherboard, electronic circuit elements (not illustrated), such as a central processing unit (CPU), a chip set for CPU, memory, graphic chips and audio circuits, are mounted. A connecting unit 22 which is slightly raised from a portion on which the keyboard 21 is provided is formed on the rear end side of the main body 2 (i.e., the main body housing 20).

Next, the display device 4 will be described. A housing of the display device 4 (hereafter, "LCD housing") is denoted by the reference numeral 40. The LCD housing 40 is formed as a panel. The display device 4 includes an LCD panel 41. The side on which the LCD panel 41 is provided is referred to as the "front" and the opposite side thereof is referred to as the "back" of the display device 4. An end of the display device 4 at which the display device 4 is connected to the main body 2 via the hinge 3 is referred to as the "lower end" and the opposite end thereof is referred to as the "upper end." A connecting unit 42 is formed at the lower end of the display device 4 for the connection with the connecting unit 22 of the main body 2 by hinge connection. The connecting unit 42 of the display device 4 is pivotably connected to the connecting unit 22 of the main body 2 to form the hinge 3.

Figure 8:
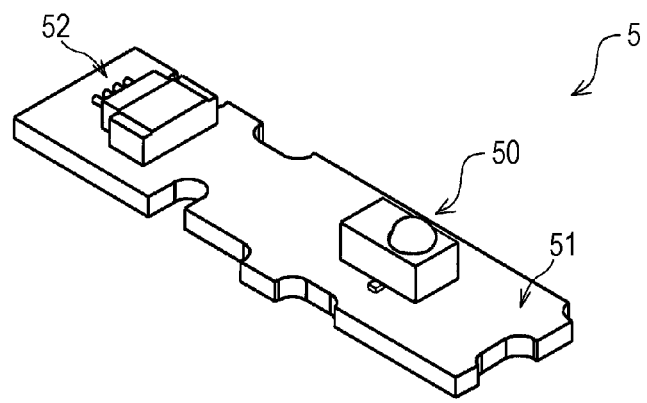
FIG. 8 is an exterior perspective view of an infrared sensor according to the first embodiment.

The electronic device 1 includes an infrared sensor 5 which receives an infrared signal emitted from the infrared ray emission unit 301 of the remote controller 300 as an external device (see the FIG. 2). FIG. 8 is an exterior perspective view of the infrared sensor 5 according to the first embodiment. The infrared sensor 5 includes a light receiving unit 50, a sensor substrate 51 and a connector 52. The light receiving unit 50 and the connector 52 are disposed on the sensor substrate 51. The connector 52 is a terminal for causing wires, which are connected to the light receiving unit 50, to be conducted to an electronic component on the side of the main body 2. The light receiving unit 50 of the infrared sensor 5 receives the infrared signal emitted by the remote controller 300. When the light receiving unit 50 receives an infrared signal, the CPU of the electronic device 1 performs predetermined processes in accordance with program in response to the received infrared signal. An optical axis of the infrared sensor 5 illustrated in FIG. 8 is parallel to the normal direction of the sensor substrate 51. However, the direction of the optical axis is illustrative only and may be changed suitably.

Figure 9:
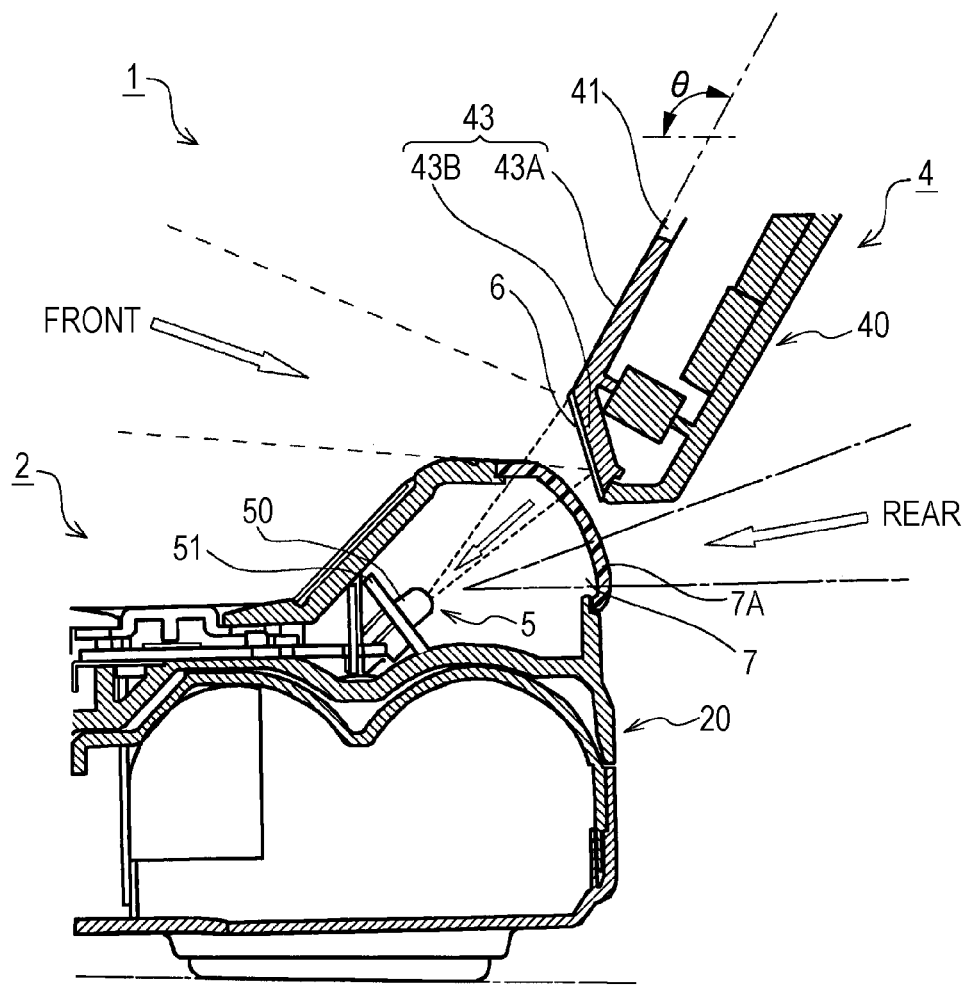
FIG. 9 illustrates a state in which the infrared sensor, a mirror body and an infrared ray transmitting unit according to the first embodiment are arranged.

FIG. 9 illustrates a state in which the infrared sensor 5, a mirror body 6 and an opening 7 according to the present embodiment are arranged. The opening 7 is provided in the main body housing 20. The infrared signals from the outside enter the main body housing 20 through the opening 7.

As illustrated also in FIG. 6, the opening 7 is provided on the rear side of the main body housing 20. The position and the size of the opening 7 are adjusted so as not to be covered by the display device 4 and is exposed to the outside on the rear side of the main body 2 in a state in which a relative angle θ of the display device 4 with respect to the main body 2 (hereafter, "display open angle") is equal to or smaller than a reference angle. The reference angle is not limited to a specific angle. For example, the reference angle may be determined such that, when the user who is located in front of the main body 2 and is viewing the opened LCD panel 41 of the display device 4 may understand the displayed content without difficulty. In the example illustrated in FIG. 9, when the display open angle θ becomes 120 degrees, the opening 7 is exposed to the outside. Alternatively, the opening 7 may be provided in the main body housing 20 so as not to be covered by the LCD housing 40 regardless of the opening degree of the display device 4.

In the example illustrated in FIG. 6, the opening 7 is formed near a central portion of a hinge axis of the main body housing 20. Alternatively, however, the opening 7 may be formed at a position near an end of the hinge axis. An infrared transmission filter 7A is fit into the opening 7. The shape of the infrared transmission filter 7A corresponds to that of the opening 7. The infrared transmission filter 7A may be infrared ray transmission resin or transparent resin to which infrared ray transmission paint is applied. Exemplary infrared ray transmission resin is acrylic resin: but other materials than acrylic resin may also be used as infrared ray transmission resin. Note that the opening 7 may be in any form as long as the infrared ray passes through the same: for example, providing the infrared transmission filter 7A in the main body housing 20 does not have to be used.

Figure 10:
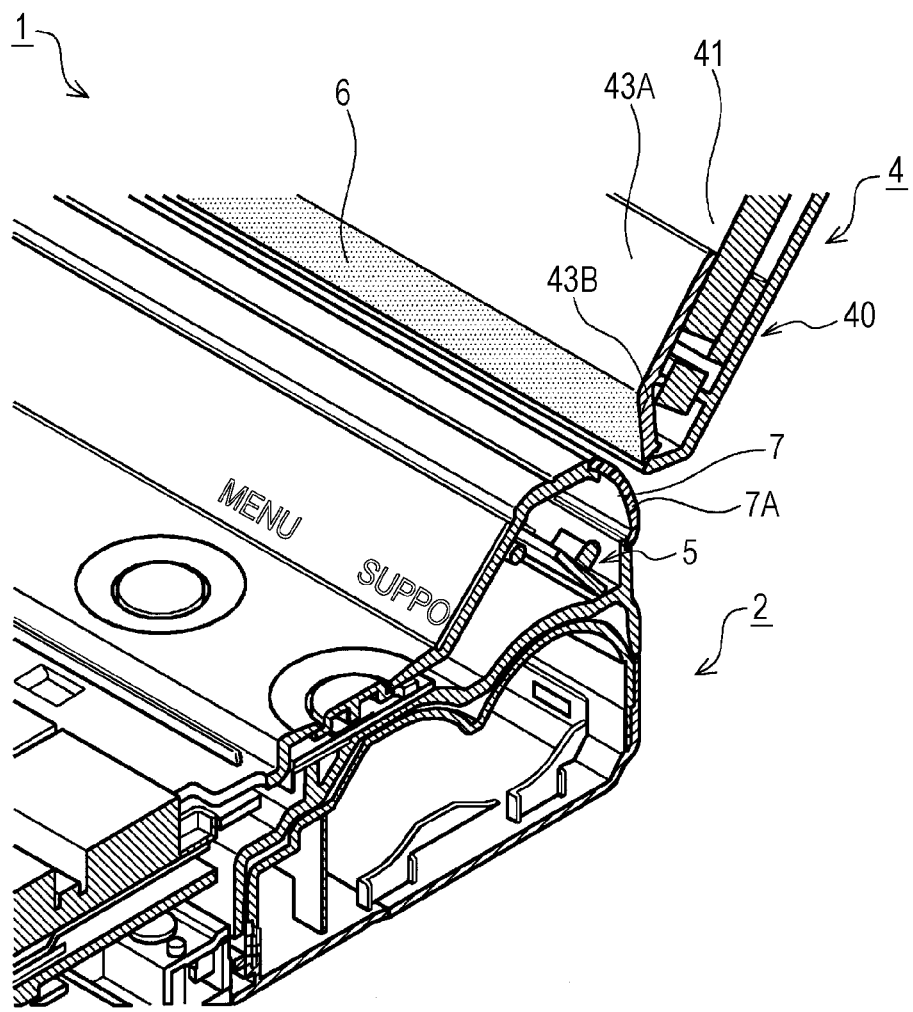
FIG. 10 is a perspective view of a cross section of the electronic device according to the first embodiment.
Figure 11:
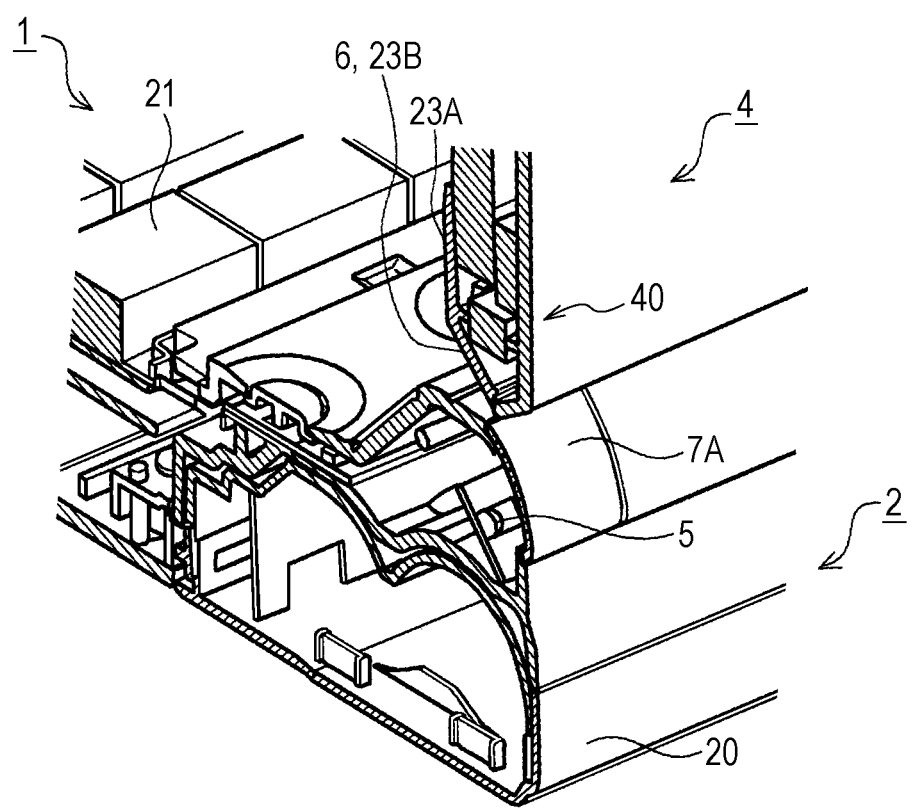
FIG. 11 is a perspective view of a cross section of the electronic device according to the first embodiment.
Figure 12:
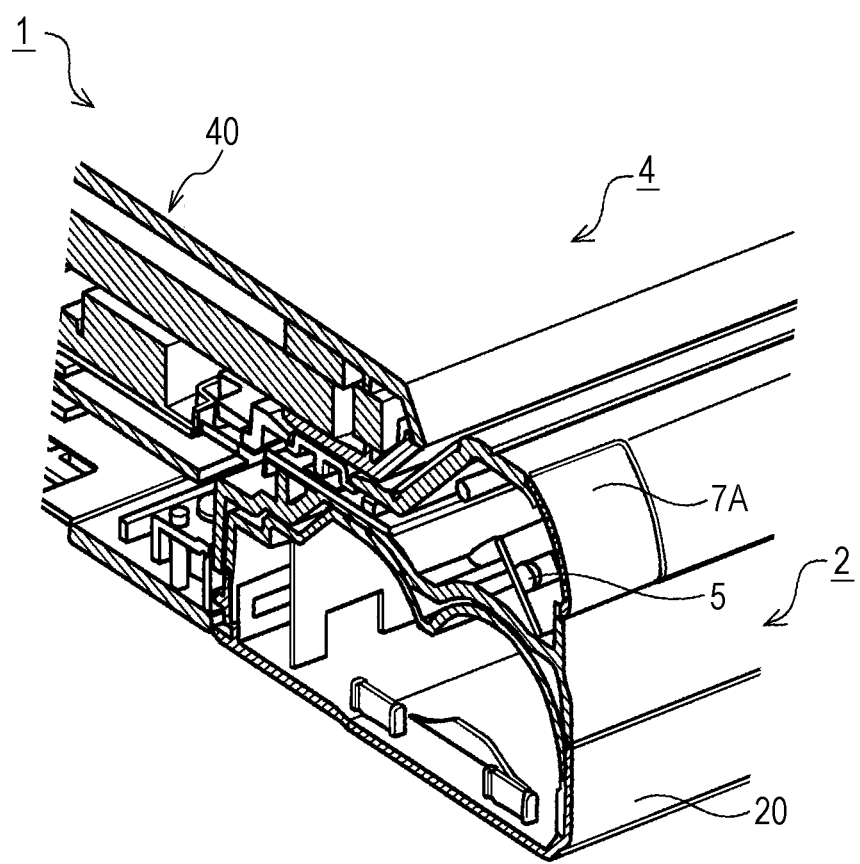
FIG. 12 is a perspective view of a cross section of the electronic device according to the first embodiment.

Each of FIGS. 10 to 12 is a perspective view of a cross section of the electronic device 1 according to the first embodiment. The cutting surface in each FIGS. 10 to 12 intersects perpendicularly the electronic device 1 in the width direction, and intersects along the light receiving unit 50 and the opening 7 of the infrared sensor 5. FIG. 10 and FIG. 11 each illustrate the electronic device 1 in which the display device 4 (i.e., the LCD housing 40) is opened. FIG. 10 illustrates the electronic device 1 seen from the front and FIG. 11 illustrates the electronic device 1 seen from the back. FIG. 12 illustrates the electronic device 1 in which the display device 4 (i.e., the LCD housing 40) is closed.

As illustrated in FIGS. 9 to 12, the infrared sensor 5 is disposed inside the main body housing 20 such that the light receiving unit 50 faces an upper rear side of the main body 2. The light receiving unit 50 of the infrared sensor 5 is disposed to be exposed to the outside through the infrared transmission filter 7A of the opening 7. For example, the direction in which detection sensitivity of infrared signals of the light receiving unit 50 becomes the maximum and the normal direction of the central portion outer surface of the opening 7 may be adjusted to be substantially the same. In the example illustrated in FIG. 9, the angle between an optical axis of the light receiving unit 50 and the horizontal plane (hereafter, "inclination angle of optical axis") is 68 degrees. However, the inclination angle of optical axis of the light receiving unit 50 may be changed suitably.

In the LCD housing 40, a portion corresponding to a lower side of a frame portion surrounding the periphery of the LCD panel 41 is referred to as a lower frame portion 43. The lower frame portion 43 includes a general portion 43A and a slope 43B. The general portion 43A is parallel to a surface of the LCD panel 41. The slope 43B is formed at an area lower than the general portion 43A and includes an obtuse edge with respect to the general portion.

The mirror body 6 for reflecting entering infrared signals is formed in the slope 43B. The mirror body 6 is an exemplary reflecting member and an exemplary optical path changing unit. The mirror body 6 may be formed by, for example, vapor-deposition or sputtering of metal foil onto the slope 43B. However, the mirror body 6 may be formed on the slope 43B by any other methods. For example, the mirror body 6 may be formed by sticking a metal plate on the slope 43B.

In a state in which the display device 4 (i.e., the LCD housing 40) is opened, the infrared signal emitted by the remote controller 300, located at the back of the main body 2, transmits the infrared transmission filter 7A of the opening 7 and enters the main body housing 20. The infrared signal which has entered the main body housing 20 is directly received by the light receiving unit 50 of the infrared sensor 5. This direct receiving of the infrared signal by the light receiving unit 50 refers to receiving the infrared signal without any reflection by, for example, the mirror body 6.

If no mirror body 6 is included in the electronic device 1, an infrared signal coming from the remote controller 300 located at the front of the main body 2 is not within a light receiving range of the light receiving unit 50 and is thus not able to be received by the light receiving unit 50. Then, in the present embodiment, the infrared signal which arrives at the main body 2 from the front of the main body 2 in a state in which the display device 4 is opened is reflected by the mirror body 6 disposed at the slope 43B of the LCD housing 40 so as to change the traveling direction of the infrared signal. The infrared signal reflected by the mirror body 6 reaches the light receiving unit 50 of the infrared sensor 5 after transmitting the infrared transmission filter 7A of the opening 7. Thus, it is possible to receive the infrared signal coming from the front to the main body 2 by the light receiving unit 50 by guiding the infrared signal toward the light receiving unit 50 using reflection by the mirror body 6.

Here, when the electronic device 1 is placed on a horizontal plane, the angle made between the plane of the mirror body 6 and the horizontal plane is referred to as a "mirror body inclination angle." A desirable range of the mirror body inclination angle is determined such that, when the user opens the display device 4, both the infrared signal coming from the back of the main body 2 and the infrared signal coming from the front of the main body 2 may be received successfully by the light receiving unit 50. For example, the mirror body inclination angle is 75 degrees under the following setting conditions: the display open angle (the angle at which the user opens the display device 4) is 120 degrees; and the inclination angle of optical axis of the light receiving unit 50 is 68 degrees. Therefore, it is possible to successfully provide both a light receiving range by the light receiving unit 50 of the infrared signal from the back of the main body 2 (represented by a dash-dot line in FIG. 9) and a light receiving range by the light receiving unit 50 of the infrared signal from the front of the main body 2 (represented by a dashed line in FIG. 9).

As described above, according to the electronic device 1 which includes the mirror body 6, the traveling direction of at least one of infrared signals coming from the first direction and the second direction, which is opposite to the first direction, toward the main body 2 may be changed and may be guided to the light receiving unit 50. That is, the electronic device 1 changes, by the mirror body 6, the travelling direction of the infrared signal which is not able to be directly received by the light receiving unit 50 among the infrared signals coming from the first direction and the second direction toward the main body housing 20, and guides to the light receiving unit 50. Therefore, even the infrared signal arriving at the main body 2 from certain directions which are not able to be directly received by the light receiving unit 50 may be received by the light receiving unit 50.

Therefore, according to the electronic device 1, infrared signals arriving at the main body 2 from opposite directions, i.e., from the front and from the back of the main body 2, may be received by the light receiving unit 50. Expansion of the light receiving range of the light receiving unit 50 in the infrared sensor 5 is achieved without changing the position or posture of the electronic device 1 or without increasing the number of the light receiving unit 50. Therefore, such an electronic device 1 is user-friendly and is manufactured with reduced cost.

In the electronic device 1, the infrared signal entering through the opening 7 from the back of the main body 2, i.e., the infrared signal which transmitted the infrared transmission filter 7A, is received by the light receiving unit 50 and, at the same time, the infrared signal coming from the front of the main body 2 is guided to the light receiving unit 50 by the mirror body 6. According to this configuration, the number of positions at which the mirror body 6 is disposed may be reduced as compared with a case in which each of the traveling directions of the infrared signals coming from both the directions is changed by the mirror bodies 6. This reduces the number of parts and the manufacturing cost.

It is also possible that the infrared signals coming from both the front and back of the main body 2 in the electronic device 1 may be reflected by one or more mirror bodies 6 and guided to the light receiving unit 50 of the infrared sensor 5. This is because directly receiving the infrared signal which has transmitted the infrared transmission filter 7A by the light receiving unit 50 is sometimes difficult depending on conditions under which the light receiving unit 50 in the infrared sensor 5 is disposed. In the electronic device 1, the number of the opening 7 provided in the main body housing 20 is not particularly limited: for example, plural openings 7 may be provided at plural locations.

In the present embodiment, the infrared signal emitted from the back of the main body housing 20 is the optical signal coming from the first direction and the infrared signal emitted from the front of the main body housing 20 is the optical signal coming from the second direction, but the directions of the infrared signals are not limited to the same. For example, the traveling direction of the infrared signal emitted from at least one the left and right sides of the main body housing 20 may be changed by the mirror body 6 and may be guided toward the light receiving unit 50.

Second Embodiment

Figure 13:
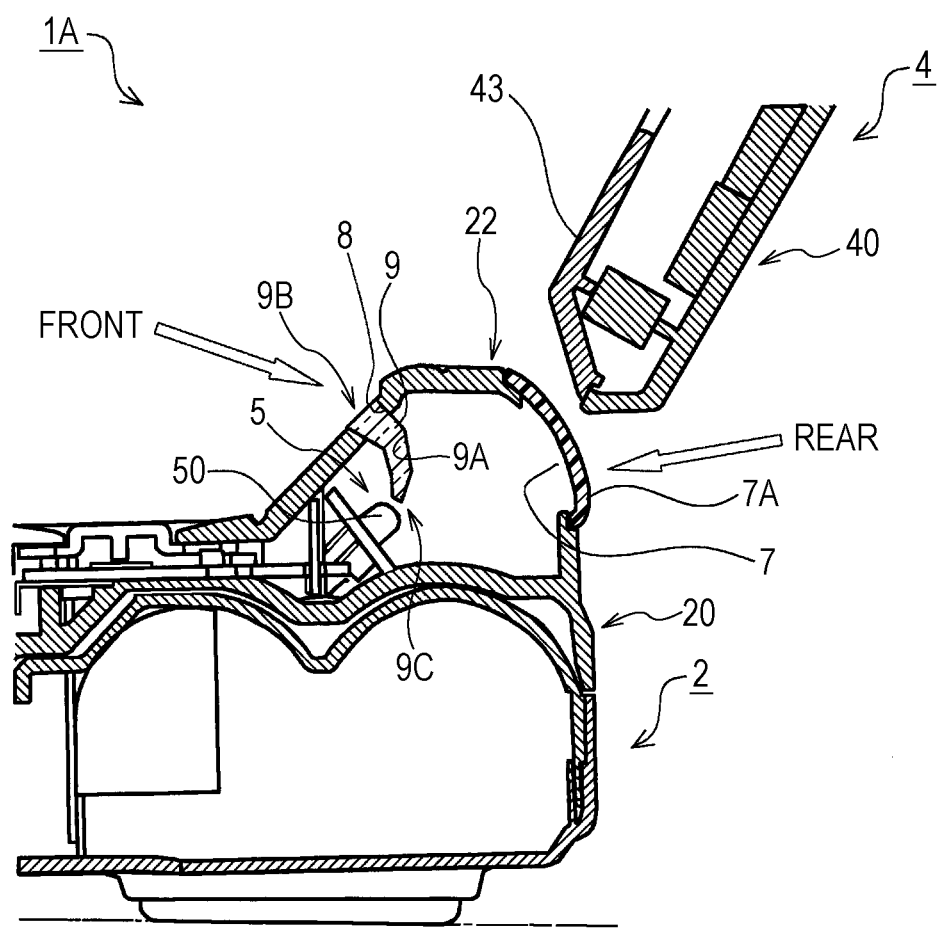
FIG. 13 is a cross-sectional view of an electronic device according to a second embodiment.

FIG. 13 is a cross-sectional view of an electronic device 1A according to a second embodiment. The same components as those of the first embodiment will be denoted by the same reference numerals and detailed description thereof will be omitted. The electronic device 1A includes a light guide member 9, instead of the mirror body 6, as a member which guides the infrared signal emitted by the remote controller 300 located at the front side of the main body 2 toward the light receiving unit 50 of the infrared sensor 5.

In the main body housing 20, a second opening 8 which is an opening is formed further forward than the opening 7. The second opening 8 is, which is similar to the opening 7, an opening through which the infrared signal enters the main body housing 20. The second opening 8 is exposed to the outside when the display device 4 is in its opened state.

Next, the light guide member 9 will be described. The light guide member 9 is a lens body which includes a light reflecting surface 9A, a light input surface 9B and a light output surface 9C. The light reflecting surface 9A is formed in a cylindrical shape. The light input surface 9B is formed at one end of the light reflecting surface 9A. The light output surface 9C is formed at the other end of the light reflecting surface 9A. The light guide member 9 guides the light entered from the light input surface 9B toward the light output surface 9C while being repeatedly reflected on the light reflecting surface 9A, and then emits from the light output surface 9C.

The shape of the light input surface 9B of the light guide member 9 is the same as that of the second opening 8. The light input surface 9B is fit into the second opening 8. The light input surface 9B is exposed to the outside through the second opening 8. The light output surface 9C is disposed to face the light receiving unit 50 of the infrared sensor 5. The infrared sensor 5 and the opening 7 are arranged in the main body housing 20 in the same manner as in the first embodiment. In the electronic device 1A, the infrared signal emitted by the remote controller 300 located at the back of the main body 2 enters the main body housing 20 through the opening 7 and is directly received by the light receiving unit 50 of the infrared sensor 5.

In a state in which the display device 4 is opened, the infrared signal emitted from the front of the main body 2 enters the light input surface 9B of the light guide member 9 through the second opening 8. The infrared ray which has entered the light input surface 9B is repeatedly reflected on, for example, the light reflecting surface 9A and is output from the light output surface 9C. Since the light output surface 9C faces the light receiving unit 50 of the infrared sensor 5, the light receiving unit 50 may receive the infrared signal emitted from the light output surface 9C.

As described above, in the electronic device 1A, since the infrared signal which arrives at the main body 2 from the remote controller 300 located at the front of the main body 2 is guided toward the light receiving unit 50 by the light guide member 9, the same advantageous effect as that of the first embodiment is obtained. That is, according to the electronic device 1A, infrared signals directed to the main body 2 from opposite directions may be received by the light receiving unit 50 without changing the position or posture of the electronic device 1A or without increasing the number of the light receiving unit 50 in the electronic device 1A.

The light guide member 9 may be made of any material that may guide the infrared signal from the second opening 8 to the light receiving unit 50. For example, optical fiber may be used. The light reflecting surface 9A of the light guide member 9 may be covered with a metallic material, such as aluminum or gold. Therefore, reflectance with respect to the infrared signal on the light reflecting surface 9A may be further increased. In the electronic device 1A, it is also possible to guide the infrared signal coming from the back of the main body 2 by the light guide member in the same manner as the infrared signal coming from the front of the main body 2.

Third Embodiment

Figure 14:
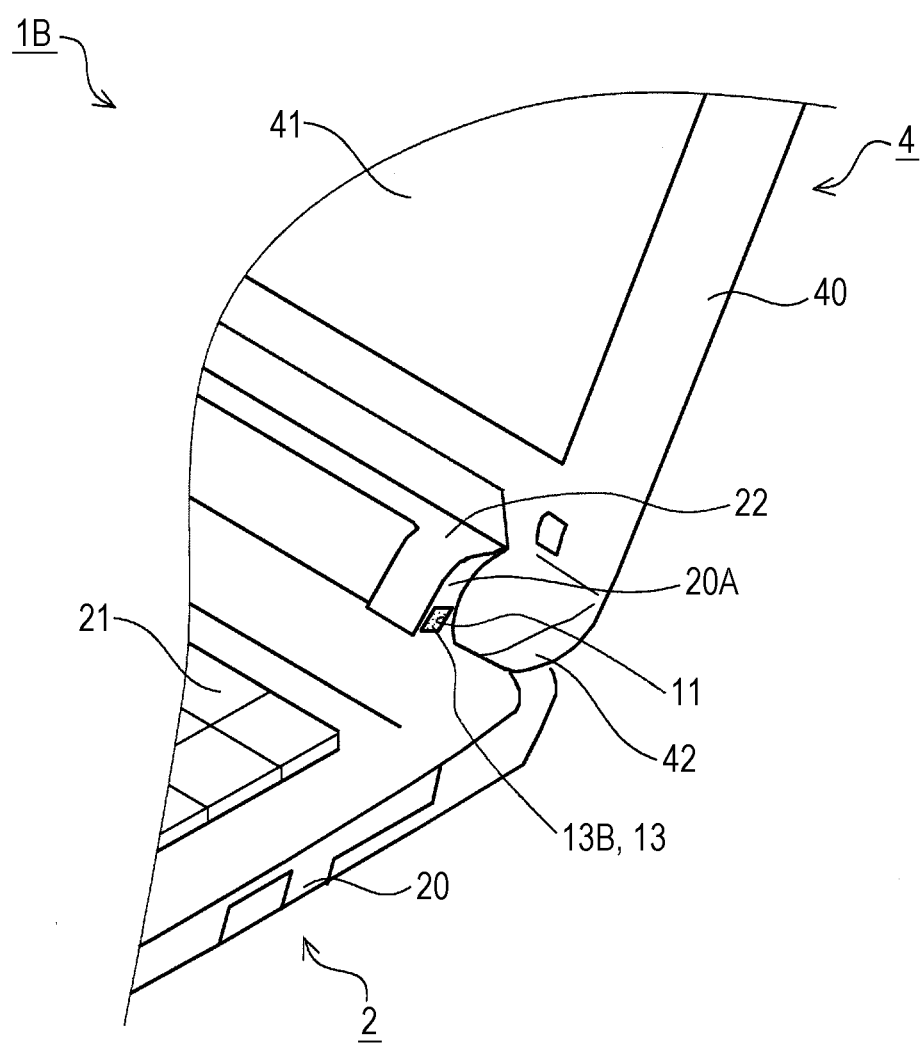
FIG. 14 is a fragmentary perspective view of an electronic device according to a third embodiment.

FIG. 14 is a fragmentary perspective view of an electronic device 1B according to a third embodiment. FIG. 14 mainly illustrates a right hinge section of the electronic device 1B. The same components as those of the foregoing embodiments will be denoted by the same reference numerals and detailed description thereof will be omitted.

In the main body 2, a lateral opening 11 is formed in a lateral wall portion 20A of a connecting unit 22. An infrared signal enters the main body housing 20 from outside through the lateral opening 11. The electronic device 1B includes lateral light guide members 13 which guide the infrared ray coming from outside to the light receiving unit 50 of the infrared sensor 5 through the lateral opening 11. Other features of the electronic device 1B are the same as those of the electronic device 1A according to the second embodiment. Although not illustrated in FIG. 14, the same lateral opening 11 as that provided in the right side is provided in a lateral wall portion on the left side of the connecting unit 22.

Figure 15:
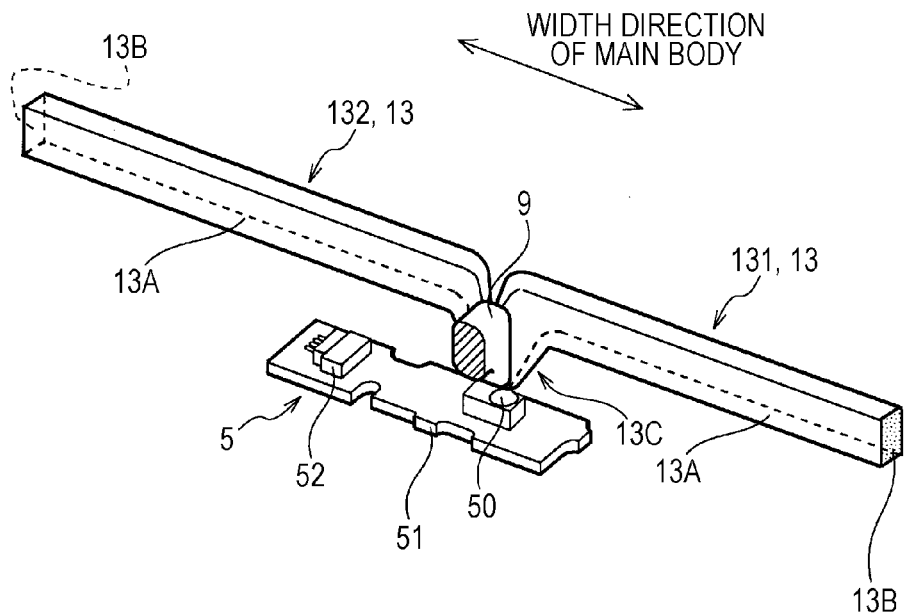
FIG. 15 is an explanatory view illustrating a lateral light guide member according to the third embodiment.

FIG. 15 is an explanatory view illustrating the lateral light guide members 13 according to the third embodiment. A positional relationship of a pair of lateral light guide members 13, an infrared sensor 5 and a light guide member 9 disposed inside the main body housing 20 is illustrated in FIG. 15. The infrared sensor 5 and the light guide member 9 illustrated in FIG. 15 are the same as those of the second embodiment and thus detailed description thereof will be omitted. A pair of lateral light guide members 13 extending in the width direction of the main body 2, i.e., an axial direction of a hinge, is disposed inside and on the rear side of the main body housing 20. In FIG. 15, the lateral light guide member 13 disposed on the right side of infrared sensor 5 is referred to as a first lateral light guide member 131, and the lateral light guide member 13 disposed on the left side of the infrared sensor 5 is referred to as a second lateral light guide member 132.

Each of the lateral light guide members 13 (131, 132) includes substantially the same light guide mechanism as that of the light guide member 9 described above. That is, each lateral light guide member 13 (131, 132) is a light guide member which includes a light reflecting surface 13A, a light input surface 13B and a light output surface 13C. The light reflecting surface 13A is formed in a cylindrical shape. The light input surface 13B is formed at one end of the light reflecting surface 13A. The light output surface 13C is formed at the other end of the light reflecting surface 13A. Each lateral light guide member 13 (131, 132) guides the light entered from the light input surface 13B toward the light output surface 13C while being repeatedly reflected on the light reflecting surface 13A, and then emits from the light output surface 13C.

The light output surface 13C in each lateral light guide member 13 (131, 132) is disposed to face the light receiving unit 50 of the infrared sensor 5. In the first lateral light guide member 131, the light input surface 13B is fit into the lateral opening 11 formed in the lateral wall portion 20A on the right side of the connecting unit 22, and the light input surface 13B is exposed to the outside through the lateral opening 11. The light input surface 13B of the second lateral light guide member 132 is fit into the lateral opening 11 formed in the lateral wall portion on the left side of the connecting unit 22, and the light input surface 13B is exposed to the outside through the lateral opening 11.

The first lateral light guide member 131 takes the infrared signal coming from the right side of the main body 2 through the light input surface 13B provided in the lateral opening 11 and guides the taken infrared signal to the light receiving unit 50 of the infrared sensor 5. The second lateral light guide member 132 takes the infrared signal coming from the left side of the main body 2 through the light input surface 13B provided in the lateral opening 11 and guides the taken infrared signal to the light receiving unit 50 of the infrared sensor 5.

As described above, since the electronic device 1B includes a pair of lateral light guide members 13, the infrared signals arriving at the main body 2 from both right and left sides of the main body 2 may be received by the light receiving unit 50. Therefore, it is possible to further increase a light receiving range of the light receiving unit 50 of the infrared sensor 5 provided in the electronic device 1B.

Note that the electronic device 1B may include only one of the first lateral light guide member 131 and the second lateral light guide member 132. In that case, the light receiving range of the light receiving unit 50 of the infrared sensor 5 may be increased while achieving simplification in structure and reduction in manufacturing cost at the same time. The first lateral light guide member 131 and the second lateral light guide member 132 may be made of, for example, optical fiber. The light reflecting surface 13A of the lateral light guide member 13 may be covered with a metallic material, such as aluminum or gold, so as to increase reflectance with respect to the infrared ray on the light reflecting surface 13A. The cross sectional shapes of the lateral light guide member 13 and the light guide member 9 is not limited to that illustrated in FIG. 15, but may be changed suitably.

Figure 16:
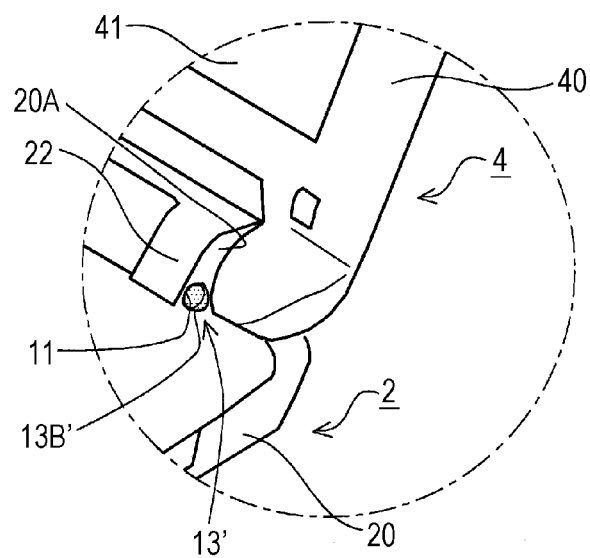
FIG. 16 illustrates a modification of the lateral light guide member according to the third embodiment.

FIG. 16 illustrates a modification of the lateral light guide member according to the third embodiment. A lateral light guide member 13' according to this modification differs from the lateral light guide member 13 illustrated in FIGS. 14 and 15 in a structure at one end at which a light input surface 13B is formed. The lateral light guide member 13' includes a light input surface 13B' which protrudes outside the main body housing 20 from a lateral opening 11. In an example illustrated in FIG. 16, the light input surface 13B' is formed as a dome-shaped curved surface.

Since the lateral light guide member 13' includes the light input surface 13B' which protrudes outside the main body housing 20 from the lateral opening 11, the infrared signal having reached the light input surface 13B' is refracted and easily enters the lateral light guide member 13'. Therefore, it is possible that, in addition to the infrared signal arriving at the main body 2 (i.e., the main body housing 20) from the lateral directions of the main body 2, infrared signals coming from, for example, the upper and the front directions of the main body 2 may also enter the main body 2 through the light input surface 13A and may be guided to the light receiving unit 50 of the infrared sensor 5. Therefore, a light receiving range of the light receiving unit 50 of the infrared sensor 5 may be further increased. The structure of the light input surface 13B' according to this modification may be applied, for example to the light guide member 9. In that case, it is possible to let the infrared signal more easily enter from the light input surface 9B of the light guide member 9 and thus let the infrared signal emitted by the remote controller 300 be more reliably guided to the light receiving unit 50.

Fourth Embodiment

Figure 17:
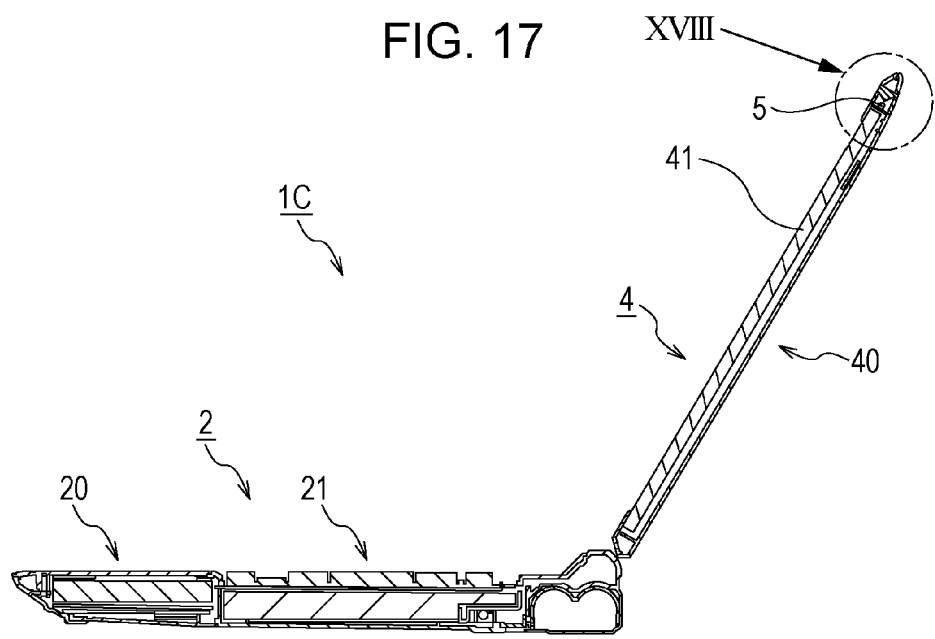
FIG. 17 is a cross-sectional view of an electronic device according to a fourth embodiment.
Figure 18:
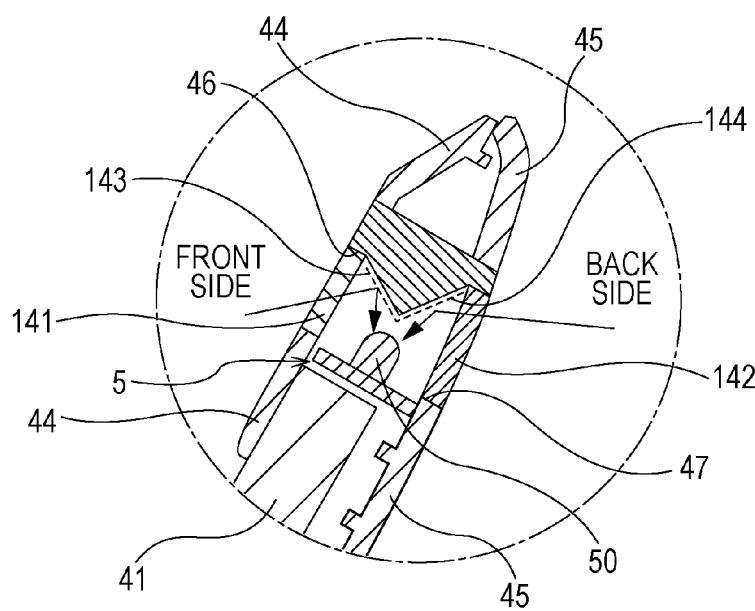
FIG. 18 is an enlarged view of an area XVIII illustrated in FIG. 17.

FIG. 17 is a cross-sectional view of an electronic device 1C according to a fourth embodiment. FIG. 18 is an enlarged view of an area XVIII illustrated in FIG. 17. The same components as those of the foregoing embodiments will be denoted by the same reference numerals and detailed description thereof will be omitted. In the electronic device 1C, an infrared sensor 5 is disposed inside an LCD housing 40. The position at which the infrared sensor 5 is disposed in the width direction of the LCD housing 40 is not particularly limited but may be changed suitably.

In FIG. 18, the infrared sensor 5 is accommodated at an upper portion of the LCD housing 40 such that an optical axis of the light receiving unit 50 is along the plane direction of an LCD panel 41. However, the direction of the optical axis of the light receiving unit 50 is not limited to the same. The electronic device 1C includes openings on the front and back of the LCD housing 40. The infrared signal coming from outside is guided to the light receiving unit 50 through the openings. Hereinafter, details of the electronic device 1C will be described with reference to FIG. 18.

In the vicinity of an upper end portion of the LCD housing 40, a portion corresponding to an upper side of a frame portion surrounding the periphery of the LCD panel 41 is referred to as an upper frame portion 44. A back cover portion which forms a back side of the LCD housing 40 is denoted by the reference numeral 45. The upper frame portion 44 includes a front side opening 46. The back cover portion 45 includes a back side opening 47. The front side opening 46 and the back side opening 47 are openings through which the infrared signals emitted by the remote controller 300 are made to enter the LCD housing 40.

In the front side opening 46 and the back side opening 47, a front side transparent area 141 and a back side transparent area 142 are formed by, for example, fitting infrared ray transmission resin or transparent resin to which infrared ray transmission paint is applied. In the LCD housing 40, a front side mirror body 143 is disposed near the front side transparent area 141 and a back side mirror body 144 is disposed near the back side transparent area 142. In the present embodiment, the front side transparent area 141, the back side transparent area 142, the front side mirror body 143 and the back side mirror body 144 are formed by a single member: however, these members may be separated. The front side mirror body 143 and the back side mirror body 144 may be formed by, for example, vapor deposition or sputtering of metal foil onto a resin material.

The front side opening 46 and the back side opening 47 are formed near the light receiving unit 50 of the infrared sensor 5. In a state in which a display device 4 is opened, the infrared signal emitted toward the front of the display device 4 transmits the front side transparent area 141 and enters the LCD housing 40. The infrared signal which entered the LCD housing 40 from the front side transparent area 141 in the front side opening 46 is reflected on the front side mirror body 143 and then guided to the light receiving unit 50. Desirably, the position and angle of the front side mirror body 143 is adjusted such that the infrared signal after the reflection reaches the light receiving unit 50. Therefore, the light receiving unit 50 of the infrared sensor 5 may suitably receive the infrared signal emitted by the remote controller 300 located at the front of the display device 4.

On the other hand, the infrared signal emitted toward the back side of the display device 4 transmits the back side transparent area 142 and enters the LCD housing 40. The infrared ray entered the LCD housing 40 is reflected on the back side mirror body 144 and is guided to the light receiving unit 50. Desirably, the position and angle of the back side mirror body 144 is adjusted such that the infrared signal after the reflection reaches the light receiving unit 50. Therefore, the light receiving unit 50 of the infrared sensor 5 may suitably receive the infrared signal emitted by the remote controller 300 located at the back of the display device 4. In a state in which the display device 4 is closed, the back side transparent area 142 is still being exposed to the outside. Therefore, even in the state in which the display device 4 is closed, the infrared signal having entered through the back side transparent area 142 may be received by the light receiving unit 50 by letting the infrared signal be reflected on the back side mirror body 144.

As described above, in the electronic device 1C according to the present embodiment, it is possible to change the traveling direction of the infrared signals arriving at the display device 4 from both the front and back direction by each of the mirror bodies 143 and 144 and to guide to the light receiving unit 50. Therefore, the infrared signals coming from both the directions may be received by the light receiving unit 50 of the infrared sensor 5 without changing the position or posture of the electronic device 1C or without increasing the number of the light receiving unit 50. Therefore, a user-friendly and less expensive electronic device may be provided.

Fifth Embodiment

Figure 19:
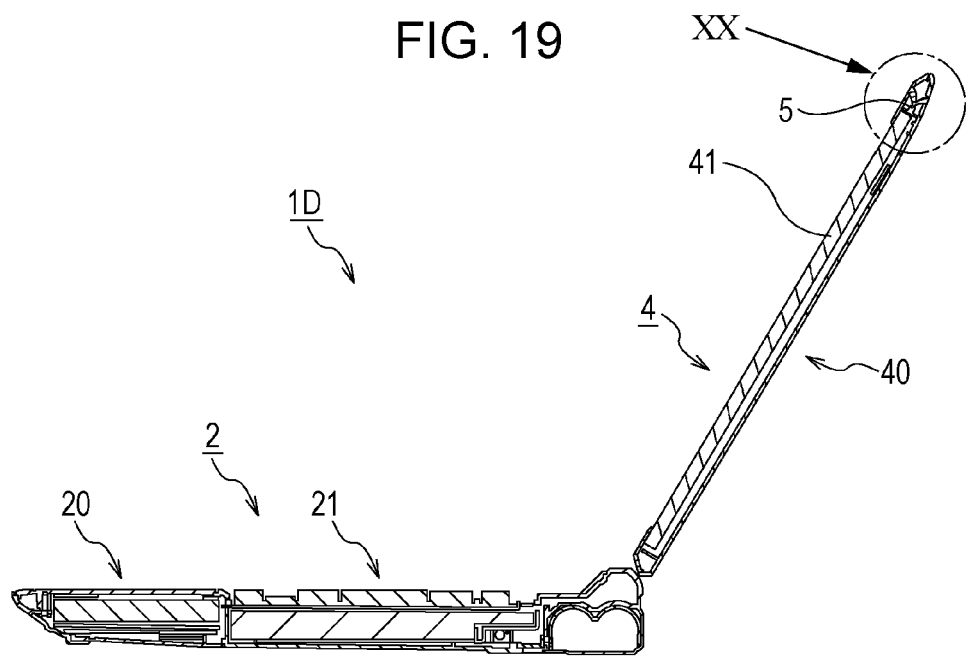
FIG. 19 is a cross-sectional view of an electronic device according to a fifth embodiment.
Figure 20:
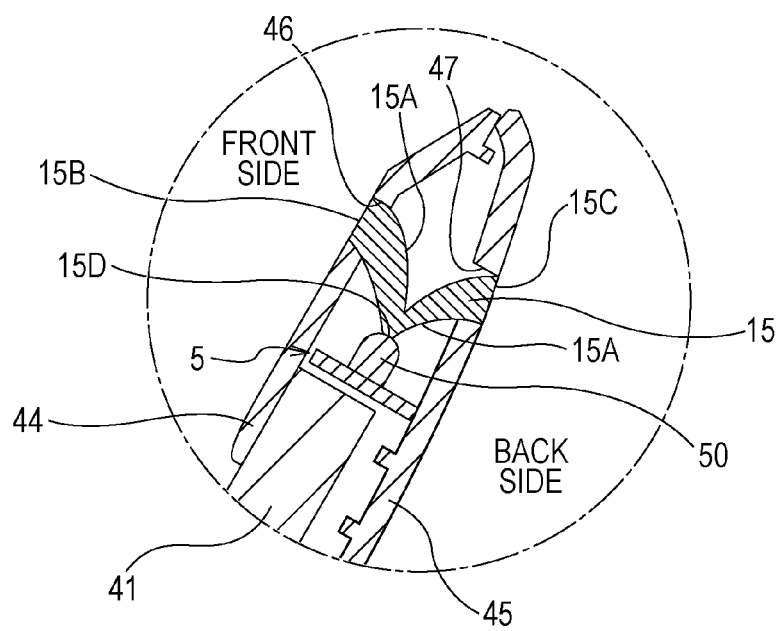
FIG. 20 is an enlarged view of an area XX illustrated in FIG. 19.

FIG. 19 is a cross-sectional view of an electronic device 1D according to a fifth embodiment. FIG. 20 is an enlarged view of an area XX illustrated in FIG. 19. The same components as those of the foregoing embodiments will be denoted by the same reference numerals and detailed description thereof will be omitted. The electronic device 1D differs from the electronic device 1C of the fourth embodiment in that a light guide member 15 is included instead of the front side mirror body 143 and the back side mirror body 144.

The light guide member 15 is a light guide member which has a structure that is substantially equivalent to two above-described light guide members 9. The light guide member 15 includes light reflecting surfaces 15A, a first light input surface 15B, a second light input surface 15C and a light output surface 15D. The light guide member 15 is formed by two cylindrical bodies which join at their ends. The light reflecting surfaces 15A are formed as inner wall surfaces of the cylindrical bodies. The light output surface 15D is formed at an end surface at which the two cylindrical bodies join. The first light input surface 15B and the second light input surface 15C are formed at the ends opposite to the light output surface 15D, i.e., at the branched ends.

The first light input surface 15B of the light guide member 15 is disposed at a front side opening 46 and the second light input surface 15C is disposed at a back side opening 47. The light output surface 15D faces the light receiving unit 50 of the infrared sensor 5. The infrared signals which entered from the first light input surface 15B and the second light input surface 15C are reflected on the light reflecting surfaces 15A and guided to the light output surface 15D. The light output surface 15D outputs the infrared signals guided by the light reflecting surface 15A toward the light receiving unit 50.

The infrared signal emitted by a remote controller 300 located at the front of the opened display device 4 enters the first light input surface 15B of the light guide member 15 through the front side opening 46. The infrared signal which entered the first light input surface 15B is, for example, repeatedly reflected on the light reflecting surface 15A and is then output toward the light receiving unit 50 from the light output surface 15D. The infrared signal emitted by the remote controller 300 located at the back of the display device 4 enters the second light input surface 15C of the light guide member 15 through the back side opening 47. The infrared ray which entered the second light input surface 15C is, for example, repeatedly reflected on the light reflecting surface 15A and is then output toward the light receiving unit 50 from the light output surface 15D.

As described above, since the electronic device 1D of the present embodiment includes the light guide member 15, the infrared signal emitted from any of the front and back directions of the display device 4 may be received by the light receiving unit 50 of the infrared sensor 5.

Further, since the back side opening 47 is exposed to the outside even when the display device 4 is closed, the infrared signal emitted by the remote controller 300 may be guided to the light receiving unit 50 through the back side opening 47 and may be received. The light guide member 15 may be made of any material that may guide the infrared signal from each of the front side opening 46 and the back side opening 47 to the light receiving unit 50. For example, the light guide member 15 may be made of optical fiber. The light reflecting surface 15A may be covered with a metallic material, such as aluminum or gold, so as to increase reflectance with respect to the infrared ray on the light reflecting surface 15A. In the light guide member 15, a portion for guiding the infrared signal which entered from the first light input surface 15B to the light receiving unit 50 and a portion for guiding the infrared signal which entered from the second light input surface 15C to the light receiving unit 50 may be formed by separate light guide members. The light guide member 15 of the present embodiment may be used in combination with the mirror body according to the fourth embodiment.

Sixth Embodiment

Figure 21:
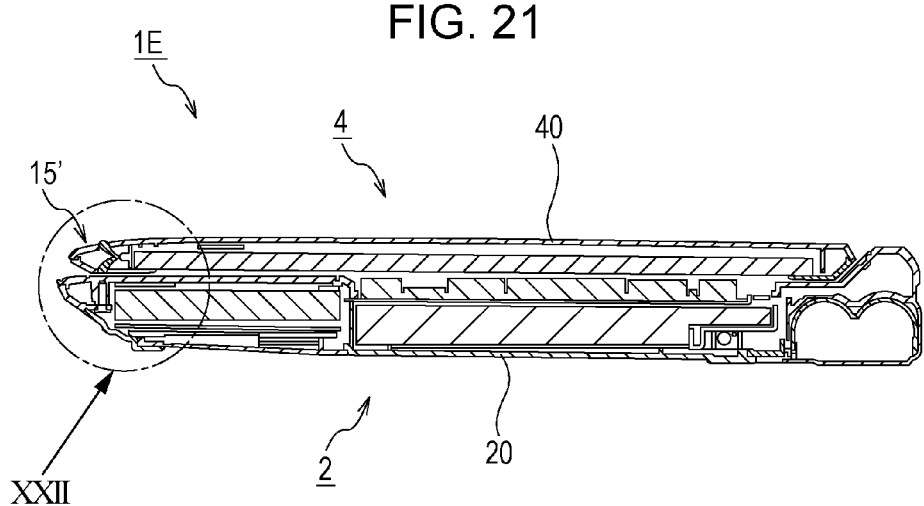
FIG. 21 is a cross-sectional view of an electronic device according to a sixth embodiment.
Figure 22:
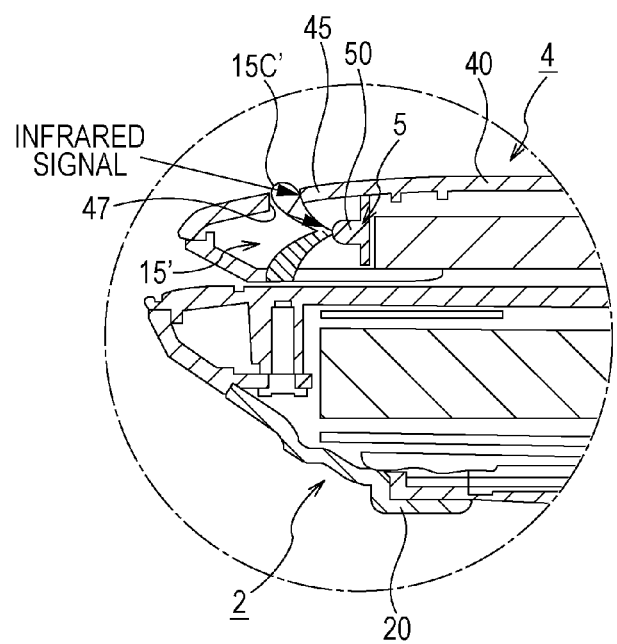
FIG. 22 is an enlarged view of an area XXII illustrated in FIG. 21.

FIG. 21 is a cross-sectional view of an electronic device 1E according to a sixth embodiment. FIG. 22 is an enlarged view of an area XXII illustrated in FIG. 21. The same components as those of the foregoing embodiments will be denoted by the same reference numerals and detailed description thereof will be omitted. The electronic device 1E includes a light guide member 15' instead of the light guide member 15. The light guide member 15' includes a second light input surface 15C' which protrudes outside an LCD housing 40 from a back side opening 47. In an example illustrated in FIG. 22, the second light input surface 15C' is formed as a dome-shaped curved surface.

Here, if the display device 4 (i.e., the LCD housing 40) of the electronic device 1E which is placed, for example, on a horizontal plane is closed, the angle between the back cover portion 45 and the horizontal plane is relatively small as illustrated in FIG. 22. Therefore, in the state in which the display device 4 is closed, it is not easy to receive, by the light receiving unit 50 of the infrared sensor 5, the infrared signal emitted by the remote controller 300 located at the front of the main body 2.

However, since the electronic device 1E includes the second light input surface 15C' which protrudes outside the LCD housing 40 from the back side opening 47, total reflection of the infrared signals coming at acute angles to the back cover portion 45 may be reduced. Therefore, the infrared signals coming at acute angles are easily taken into the light guide member 15' from the second light input surface 15C'. According to the electronic device 1E, in the state in which the display device 4 is closed, the infrared signal emitted by the remote controller 300 located at the front of the main body 2 may also be guided suitably to the light receiving unit 50.

Seventh Embodiment

Figure 23:
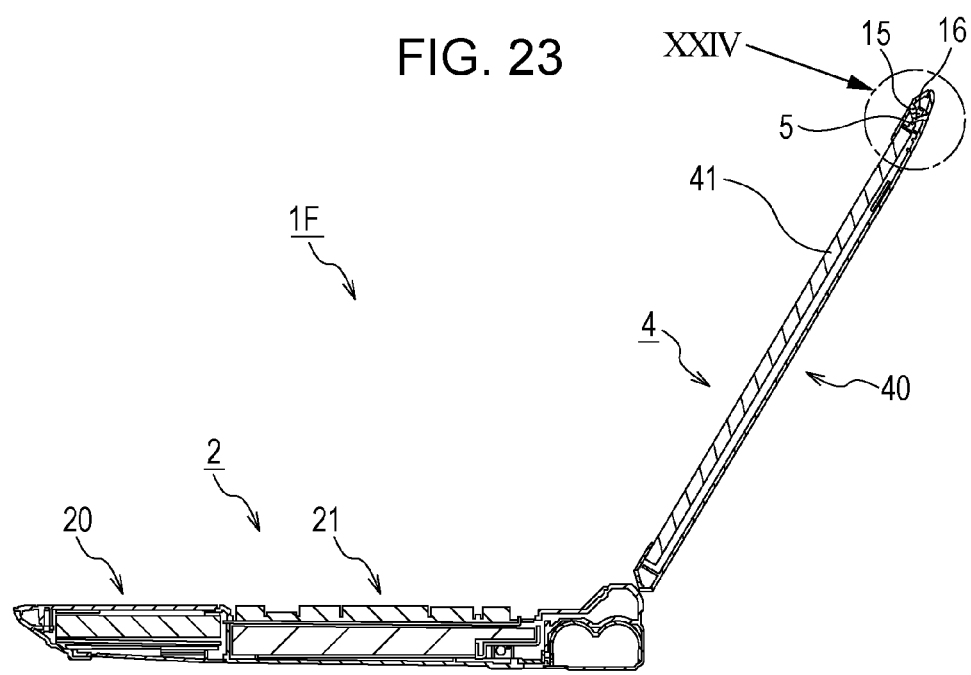
FIG. 23 is a cross-sectional view of an electronic device according to a seventh embodiment.
Figure 24:
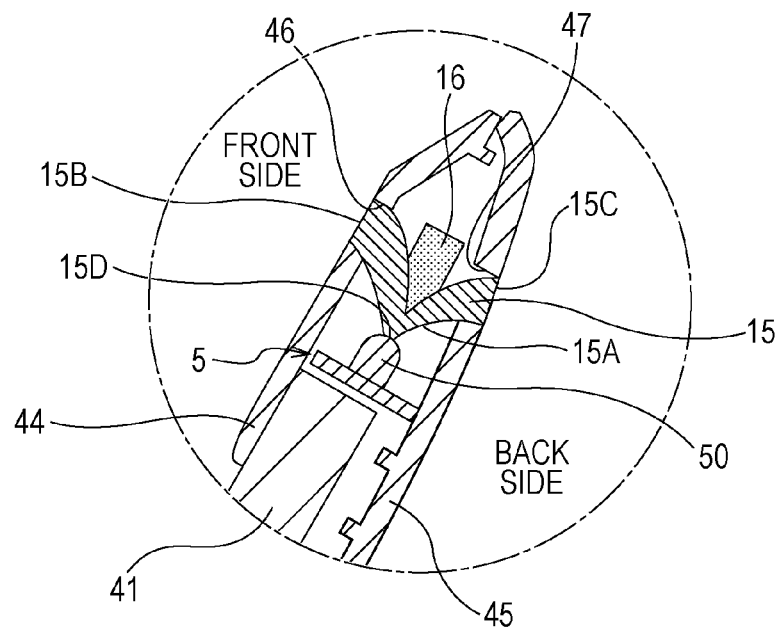
FIG. 24 is an enlarged view of an area XXIV illustrated in FIG. 23.
Figure 25:
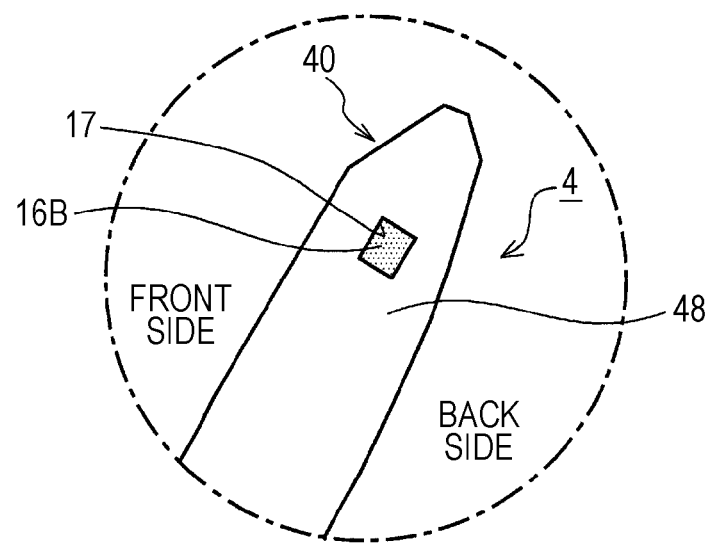
FIG. 25 is a main part enlarged view of a right lateral wall surface of an LCD housing according to the seventh embodiment.
Figure 26:
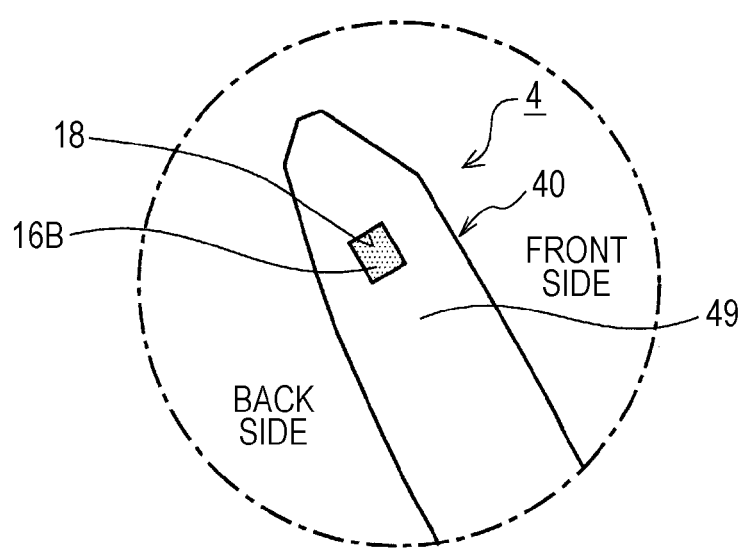
FIG. 26 is a main part enlarged view of a left lateral wall surface of the LCD housing according to the seventh embodiment.

FIG. 23 is a cross-sectional view of an electronic device 1F according to a seventh embodiment. FIG. 24 is an enlarged view of an area XXIV illustrated in FIG. 23. FIG. 25 is a main part enlarged view of a right lateral wall surface of an LCD housing 40 according to the seventh embodiment. FIG. 26 is a main part enlarged view of a left lateral wall surface of the LCD housing 40 according to the seventh embodiment. An upper area of a right lateral wall surface 48 of the LCD housing 40 is illustrated in FIG. 25. An upper area of a left lateral wall surface 49 of the LCD housing 40 is illustrated in FIG. 26.

A first lateral opening 17 which is an opening through which the infrared signal coming from the outside enters the LCD housing 40 is formed in the right lateral wall surface 48 of the LCD housing 40. A second lateral opening 18 which is an opening through which the infrared signal coming from the outside enters the LCD housing 40 is formed in the left lateral wall surface 49 of the LCD housing 40.

Figure 27:
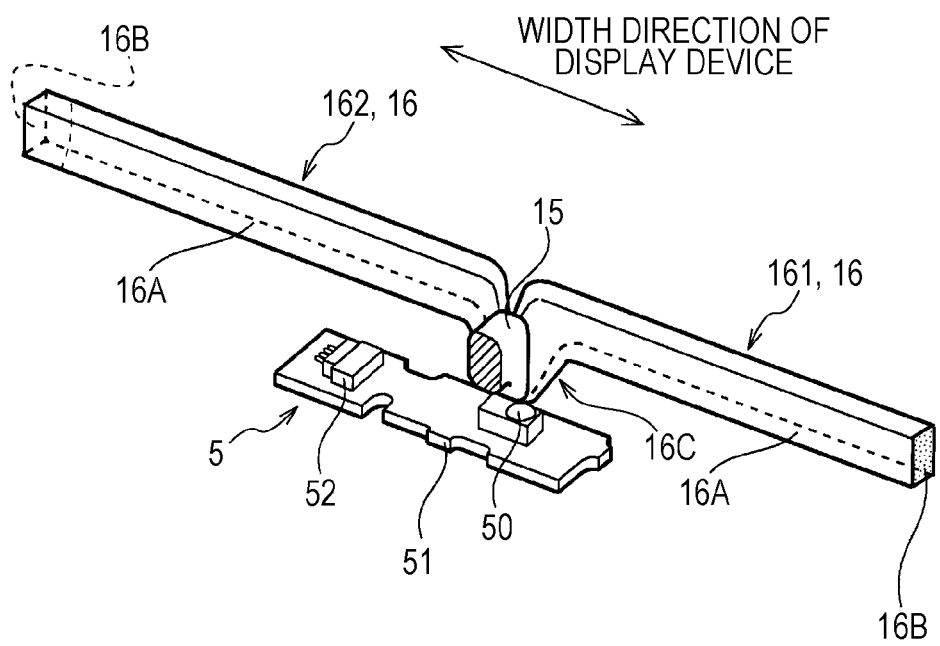
FIG. 27 is an explanatory view illustrating a lateral light guide member according to the seventh embodiment.

As illustrated in FIG. 24, a pair of lateral light guide members 16 is provided inside the LCD housing 40. FIG. 27 is an explanatory view illustrating the lateral light guide members 16 according to the seventh embodiment. A pair of lateral light guide members 16 extending in the width direction of the display device 4 is provided inside the LCD housing 40. The infrared sensor 5 and the light guide member 15 illustrated in FIG. 27 are the same as those of the fifth embodiment and thus detailed description thereof will be omitted. In FIG. 25, the lateral light guide member 16 disposed on the right side of infrared sensor 5 is referred to as a first lateral light guide member 161, and the lateral light guide member 16 disposed on the left side of the infrared sensor 5 is referred to as a second lateral light guide member 162.

A pair of lateral light guide members 16 (161, 162) has the same light guide mechanism as that of the lateral light guide member 13 (see the FIG. 15) according to the third embodiment. Each lateral light guide member 16 (161, 162) is a light guide member which includes a light reflecting surface 16A, a light input surface 16B and a light output surface 16C. The light reflecting surface 16A is formed in a cylindrical shape. The light input surface 16B is formed at one end of the light reflecting surface 16A. The light output surface 16C is formed at the other end of the light reflecting surface 16A.

The light output surface 16C of each lateral light guide member 16 (161, 162) faces the light receiving unit 50 of the infrared sensor 5. The light input surface 16B in the first lateral light guide member 161 and the first lateral opening 17 formed in the right lateral wall surface 48 in the LCD housing 40 are the same in shape. The light input surface 16B of the first lateral light guide member 161 is fit into the first lateral opening 17. The light input surface 16B in the second lateral light guide member 162 and the second lateral opening 18 formed in the left lateral wall surface 49 in the LCD housing 40 are the same in shape. The light input surface 16B of the second lateral light guide member 162 is fit in the second lateral opening 18.

The first lateral light guide member 161 and the second lateral light guide member 162 let the infrared signal which entered from the light input surface 16B be repeatedly reflected on the light reflecting surface 16A and guided to the light output surface 16C and then output from the light output surface 16C toward the light receiving unit 50. Therefore, according to the first lateral light guide member 161 and the second lateral light guide member 162, it is possible to take, from the light input surface 16B, the infrared signal which comes from the lateral directions with respect to the display device 4 and to guide the taken infrared signal to the light receiving unit 50 of the infrared sensor 5. This allows a further increase in the light receiving range of the light receiving unit 50 of the infrared sensor 5.

Although the electronic device 1F according to the present embodiment includes a pair of lateral light guide members 16, the electronic device 1F may include only one of the first lateral light guide member 161 and the second lateral light guide member 162. In that case, the light receiving range of the light receiving unit 50 of the infrared sensor 5 may be increased while achieving simplification in structure and reduction in manufacturing cost of the electronic device 1F at the same time. The lateral light guide member 16 according to the present embodiment may be implemented in combination with, for example, the front side mirror body 143 and the back side mirror body 144 of the electronic device 1C according to the fourth embodiment. The lateral light guide member 16 may be, for example, optical fiber. The light reflecting surface 16A may be covered with a metallic material, such as aluminum or gold, so as to increase reflectance with respect to the infrared ray on the light reflecting surface 16A.

In the present embodiment, the light input surface 16B of the first lateral light guide member 161 may protrude outside the LCD housing 40 from the first lateral opening 17. The light input surface 16B of the second lateral light guide member 162 may protrude outside the LCD housing 40 from the second lateral opening 18. This allows the infrared signal arriving at the LCD housing 40 to more easily enter from the light input surface 16B. Therefore, the infrared signal emitted by the remote controller 300 may be more reliably received by the light receiving unit 50.

Although the notebook computer has been described as an exemplary electronic device in each embodiment, the electronic device is not limited to the same. The embodiments may be applied to various electronic devices that receive optical signals from outside, such as a display device of a mobile phone and a desktop personal computer. In the embodiments described above, the infrared ray is received by the light receiving unit 50 of the infrared sensor 5 mounted in the electronic device. However, the object to be received by the light receiving unit 50 is not limited to the infrared ray. The light receiving unit 50 may also receive optical signals with straightness (directivity) and thus with less diffraction effect of going around behind the object. For example, the light receiving unit 50 may receive visible light and ultraviolet light. The foregoing embodiments may be implemented in combination with each other.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An electronic device comprising:
a housing;
an opening formed in the housing;
a light receiving unit which is disposed inside the housing and is configured to receive an optical signal which enters through the opening; and
an optical path changing unit which changes, to guide to the light receiving unit, a travelling direction of at least one of a first optical signal arriving from a first direction in respect to the housing and a second optical signal arriving from a second direction in respect to the housing, the first and second directions being opposite to each other, wherein
the housing includes a first housing and a second housing which is connected to a rear portion of the first housing via a hinge in an openable and closable manner;
the opening and the light receiving unit are provided in the first housing;
the light receiving unit directly receives the first optical signal which enters through the opening from the first direction, which is the back direction of the first housing;
the optical path changing unit includes a reflecting member provided in the second housing; and
the reflecting member causes the second optical signal, which arrives from the second direction which is the front direction of the first housing in a state in which the second housing is opened, to be reflected toward the light receiving unit.

2. An electronic device, comprising:
a housing;
an opening formed in the housing;
a light receiving unit which is disposed inside the housing and is configured to receive an optical signal which enters through the opening; and
an optical path changing unit which changes, to guide to the light receiving unit, a travelling direction of at least one of a first optical signal arriving from a first direction in respect to the housing and a second optical signal arriving from a second direction in respect to the housing, the first and second directions being opposite to each other, wherein
the housing includes a first housing and a second housing which is connected to a rear portion of the first housing via a hinge in an openable and closable manner;
the opening includes a first opening through which the first optical signal which comes from the first direction, which is the back direction of the first housing, enters and a second opening through which the second optical signal which comes from the second direction, which is the front direction of the first housing, enters;
the light receiving unit directly receives the first optical signal which enters through the first opening from the back direction of the first housing; and
the optical path changing unit includes a light guide member which guides the second optical signal, which arrives from the front direction of the first housing in a state in which the second housing is opened, to the light receiving unit through the second opening.

3. The electronic device according to claim 1, wherein
a lateral opening through which the optical signal enters the first housing is formed in a lateral wall portion of the first housing; and
the optical path changing unit further includes a lateral light guide member which guides external optical signal to the light receiving unit through the lateral opening.

4. The electronic device according to claim 2, wherein
a lateral opening through which the optical signal enters the first housing is formed in a lateral wall portion of the first housing; and
the optical path changing unit further includes a lateral light guide member which guides external optical signal to the light receiving unit through the lateral opening.

5. An electronic device, comprising:
a housing;
an opening formed in the housing;
a light receiving unit which is disposed inside the housing and is configured to receive an optical signal which enters through the opening; and
an optical path changing unit which changes, to guide to the light receiving unit, a travelling direction of at least one of a first optical signal arriving from a first direction in respect to the housing and a second optical signal arriving from a second direction in respect to the housing, the first and second directions being opposite to each other, wherein
the housing is formed as a panel;
the opening is formed in each of the wall surface of the front side and the wall surface of the back side in the housing; and
the optical path changing unit includes a reflecting member which causes the optical signal which entered through each opening formed in the wall surface of the front side and the wall surface of the back side to be reflected toward the light receiving unit.

6. An electronic device, comprising:
a housing;
an opening formed in the housing;
a light receiving unit which is disposed inside the housing and is configured to receive an optical signal which enters through the opening; and
an optical path changing unit which change guide to the light receiving unit, a travelling direction of at least one of a first optical signal arriving from a first direction in respect to the housing and a second optical signal arriving from a second direction in respect to the housing, the first and second directions being opposite to each other, wherein
the housing is formed as a panel;
the opening is formed in each of the wall surface of the front side and the wall surface of the back side in the housing; and
the optical path changing unit includes a light guide member which guides the optical signal to the light receiving unit through each opening formed in the wall surface of the front side and the wall surface of the back side.

7. The electronic device according to claim 4, wherein
a lateral opening through which the optical signal enters the housing is formed in a lateral wall portion of the housing; and
the optical path changing unit further includes a lateral light guide member which guides an external optical signal to the light receiving unit through the lateral opening.

8. An electronic device comprising:
a housing;
a light receiving unit which is disposed inside the housing and is configured to receive an optical signal; and
an optical path changing unit which changes a travelling direction of at least one of a first optical signal arriving from a first direction in respect to the housing and a second optical signal arriving from a second direction in respect to the housing so that the optical signal travelling along the changed travelling direction arrives at the light receiving unit, the first and second directions being different each other, wherein
the housing includes a first housing and a second housing which is connected to a rear portion of the first housing via a hinge in an openable and closable manner;
the opening includes a first opening through which the first optical signal which comes from the first direction, which is the back direction of the first housing, enters and a second opening through which the second optical signal which comes from the second direction, which is the front direction of the first housing, enters;
the light receiving unit directly receives the first optical signal which enters through the first opening from the back direction of the first housing; and
the optical path changing unit includes a light guide member which guides the second optical signal, which arrives from the front direction of the first housing in a state in which the second housing is opened, to the light receiving unit through the second opening.

9. The electronic device according to claim 2, wherein the light guide member includes a light input surface which protrudes outside the housing from the opening.

10. An electronic device, comprising:
a housing;
an opening formed in the housing;

a light receiving unit which is disposed inside the housing and is configured to receive an optical signal which enters through the opening along a direction; and an optical path changing unit which changes a travelling direction of at least one of a first optical signal arriving from a first direction in respect to the housing and a second optical signal arriving from a second direction in respect to the housing, the first and second directions being opposite to each other, wherein the first and second optical signals are received by the light receiving unit facing a certain direction.

\* \* \* \* \*

UNITED STATES PATENT AND TRADEMARK OFFICE
CERTIFICATE OF CORRECTION

PATENT NO. : 8,888,379 B2
APPLICATION NO. : 13/760439
DATED : November 18, 2014
INVENTOR(S) : Yasufumi Yamamoto et al.

It is certified that error appears in the above-identified patent and that said Letters Patent is hereby corrected as shown below:

On the title page item (72)

Change

"Masuo Ohnishi, Hachioji (JE)"

To

--Masuo Ohnishi, Hachioji (JP)--

Signed and Sealed this
Fifth Day of May, 2015

Michelle K. Lee
*Director of the United States Patent and Trademark Office*